United States Patent
Burry et al.

(10) Patent No.: US 12,278,090 B2
(45) Date of Patent: Apr. 15, 2025

(54) ENHANCED TUNING METHODS FOR MITIGATING RF LOAD IMPEDANCE VARIATIONS DUE TO PERIODIC DISTURBANCES

(71) Applicant: MKS Instruments, Inc., Andover, MA (US)

(72) Inventors: Aaron Burry, Ontario, NY (US); Peter Paul, Penfield, NY (US); Aaron Radomski, Conesus, NY (US)

(73) Assignee: MKS Instruments, Inc., Andover, MA (US)

( * ) Notice: Subject to any disclaimer, the term of this patent is extended or adjusted under 35 U.S.C. 154(b) by 202 days.

(21) Appl. No.: 18/302,141

(22) Filed: Apr. 18, 2023

(65) Prior Publication Data
US 2024/0355585 A1  Oct. 24, 2024

(51) Int. Cl.
*H01J 37/32* (2006.01)

(52) U.S. Cl.
CPC .. *H01J 37/32174* (2013.01); *H01J 37/32128* (2013.01); *H01J 2237/334* (2013.01)

(58) Field of Classification Search
CPC ............... H01J 37/334; H01J 37/32128; H01J 37/32174
See application file for complete search history.

(56) References Cited

U.S. PATENT DOCUMENTS

| 7,602,127 | B2 | 10/2009 | Coumou |
| 8,110,991 | B2 | 2/2012 | Coumou |
| 8,395,322 | B2 | 3/2013 | Coumou |
| 9,041,292 | B2 | 5/2015 | Coumou |
| 9,947,514 | B2 | 4/2018 | Radomski et al. |
| 10,049,857 | B2 | 8/2018 | Fisk, II et al. |

(Continued)

FOREIGN PATENT DOCUMENTS

| JP | 2018536295 A | 12/2018 |
| JP | 2020004710 A | 1/2020 |

(Continued)

OTHER PUBLICATIONS

Kohng, Sei Zhen, Dragan Nesic, and Miroslav Krstic. "Iterative learning control based on extremum seeking." *Automatica* 66 (2016): 238-245.

(Continued)

*Primary Examiner* — Jimmy T Vu

(57) ABSTRACT

A radio frequency (RF) power generation system includes a RF power source that generates a RF output signal delivered to a load. A RF power controller is configured to generate a control signal to vary the RF output signal. The controller adjusts a parameter associated with the RF output signal, and the parameter is controlled in accordance with a trigger signal. The parameter is adjusted over a predetermined number of bins. The parameter is adjusted in accordance with a cost function, and the cost function is determined by introducing a perturbation for each bin into an actuator that affects the cost function. The actuator may control an external RF output signal, and the trigger signal may vary in accordance with the external RF output signal. The perturbation is determined in accordance with a basis set having fewer dimensions than the number of bins.

41 Claims, 22 Drawing Sheets

(56) References Cited

U.S. PATENT DOCUMENTS

| | | |
|---|---|---|
| 10,269,540 B1 | 4/2019 | Carter et al. |
| 10,304,669 B1 | 5/2019 | Coumou et al. |
| 10,396,601 B2 | 8/2019 | Luu et al. |
| 10,546,724 B2 | 1/2020 | Radomski et al. |
| 10,741,363 B1 | 8/2020 | Burry et al. |
| 10,821,542 B2 | 11/2020 | Nelson et al. |
| 11,158,488 B2 | 10/2021 | Radomski et al. |
| 11,232,931 B2 | 1/2022 | Huh et al. |
| 2014/0055034 A1 | 2/2014 | Coumou |
| 2017/0018926 A1 | 1/2017 | Coumou et al. |
| 2017/0062187 A1 | 3/2017 | Radomski et al. |
| 2020/0357610 A1 | 11/2020 | Bhutta |
| 2020/0411289 A1 | 12/2020 | Radomski et al. |
| 2023/0049104 A1 | 2/2023 | Burry et al. |

FOREIGN PATENT DOCUMENTS

| | | | |
|---|---|---|---|
| KR | 10-2020-0038316 A | 4/2020 | |
| TW | 201711387 A | 3/2017 | |
| TW | 201713171 A | 4/2017 | |
| TW | 202016974 A | 5/2020 | |
| WO | WO-2010/126806 A1 | 11/2010 | |
| WO | WO-2017040415 A1 | 3/2017 | |
| WO | WO-2019070524 A1 | 4/2019 | |
| WO | WO-2020005832 A1 | 1/2020 | |
| WO | WO-2020231881 A1 | 11/2020 | |
| WO | WO-2022250997 A1 * | 12/2022 | ........ H01J 37/32045 |

OTHER PUBLICATIONS

International Search Report and Written Opinion regarding International Application No. PCT/US2021/053139, dated Jan. 21, 2022.

Taiwan Office Action regarding Application No. 110139033, dated Feb. 14, 2023.

International Search Report and Written Opinion of the ISA issued in PCT/US2024/010725, mailed May 13, 2024; ISA/US.

Japanese Office Action regarding Patent Application No. 2023518842, dated Apr. 30, 2024.

* cited by examiner

ENHANCED TUNING METHODS FOR MITIGATING RF LOAD IMPEDANCE VARIATIONS DUE TO PERIODIC DISTURBANCES

FIELD

The present disclosure relates to RF generator systems and to control of RF generators.

BACKGROUND

Plasma processing is frequently used in semiconductor fabrication. In plasma processing, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a controller for a radio frequency generator. The controller includes a RF power controller coupled to a RF power source, the RF power controller configured to generate a control signal to vary an RF output signal having a plurality of bins from the RF power source. The RF power controller is configured to adjust at least one parameter that determines a characteristic of the RF output signal in response to a synchronization signal. The parameter is perturbed in accordance with a hopping pattern associated with the plurality of bins, and the parameter is adjusted in accordance with one of minimizing or maximizing a cost function responsive to a perturbation of the at least one parameter by the hopping pattern. The hopping pattern is adjusted in accordance with a basis set having a plurality of dimensions and a number of dimensions is fewer than a number of bins. Other embodiments of this aspect include corresponding computer systems, apparatus, and computer programs recorded on one or more computer storage devices, each configured to perform the actions of the methods.

Implementations may include one or more of the following features. The controller where the RF power controller iterates through the dimensions in order to adjust the hopping pattern each iteration. More than one of the plurality of bins is adjusted during each iteration. The hopping pattern may be adjusted by applying one of an offset or a scaling factor to the hopping pattern. The perturbation of the at least one parameter for a plurality of the bins determines the hopping pattern. The basis set may include of at least one of a sinusoid, spline, polynomial, exponential, and radial basis set. A first dimension of the basis set is orthogonal to a second dimension of the basis set. Each bin has a width and the width of a selected bin may be the same as or different than the width of an other bin. A plurality of the dimensions of the basis set is determined in accordance with a Fast Fourier Transform (FFT) of the hopping pattern. A plurality of the dimensions of the basis set is determined from data analytics. A plurality of the dimensions of the basis set is determined in accordance with singular value decomposition (SVD) or principal component analysis (PCA). The RF power controller adjusts the parameter in accordance with the synchronization signal, where the synchronization signal indicates a relative position of an external RF output signal. The controller wherein the parameter is one of a frequency or a frequency offset and includes a plurality of frequencies that the RF power controller introduces to the RF output signal in a predetermined order and timing in accordance with the synchronization signal, or the parameter is one of a reactance or a reactance offset and includes a plurality of reactances controlled by the RF power controller in a predetermined order and timing in accordance with the synchronization signal, where the reactance is at least one of a capacitance or an inductance. The hopping pattern may be adjusted by applying one of an offset or a scaling factor to the hopping pattern, and the offset is adjusted by perturbing the offset to determine an effect on a cost function, generating a composite gradient in accordance with the cost function, and adjusting the offset in accordance with the one of minimizing or maximizing the cost function. The scaling factor is adjusted by perturbing a present scaling factor to determine an effect on a cost function, generating a composite gradient in accordance with the cost function, and adjusting the scaling factor in accordance with the one of minimizing or maximizing the cost function. A scaling factor is adjusted by perturbing a present scaling factor to determine an effect on a cost function, generating a composite gradient in accordance with the cost function, and adjusting the scaling factor in accordance with the one of minimizing or maximizing the cost function, and adjusting the hopping pattern by applying the scaling factor to the hopping pattern. Implementations of the described techniques may include hardware, a method or process, or computer software on a computer-accessible medium.

One general aspect includes a non-transitory computer-readable medium storing instructions. The non-transitory computer-readable medium stores instructions that include controlling a first power source to output a first output signal having a plurality of bins to a load. The instructions also include generating a control signal to vary the first output signal from the power source to adjust at least one parameter that determines a characteristic of the first output signal in response to a synchronization signal. The instructions also include perturbing the parameter in accordance with a hopping pattern associated with the plurality of bins, and the parameter is adjusted in accordance with one of minimizing or maximizing a cost function responsive to a perturbation of the at least one parameter by the hopping pattern. The instructions also include adjusting the hopping pattern by applying one of an offset or a scaling factor to the hopping pattern, or adjusting the hopping pattern in accordance with a basis set having a plurality of dimensions and a number of dimensions is equal to or fewer than a number of bins. Other embodiments of this aspect include corresponding computer systems, apparatus, and computer programs recorded on one or more computer storage devices, each configured to perform the actions of the methods.

Implementations may include one or more of the following features. The non-transitory computer-readable medium instructions may include iterating through the dimensions in order to adjust the hopping pattern each iteration. More than one of the plurality of bins is adjusted during each iteration. The basis set may include basis functions including at least one of a sinusoid, spline, polynomial, exponential, and radial basis set. The perturbation of the at least one parameter for a plurality of the bins determines the hopping pattern. Each bin has a width and the width of a selected bin may be the same as or different than the width of an other bin. The non-transitory computer-readable medium instructions may include determining a plurality of the dimensions of the basis set in accordance with a Fast Fourier Transform (FFT) of the hopping pattern. The non-transitory computer-readable medium instructions may include determining a plurality of the dimensions of the basis set using data analytics. The non-transitory computer-readable medium instructions may include determining a plurality of the dimensions of the basis set in accordance with singular value decomposition (SVD) or principal component analysis (PCA). The power controller adjusts the parameter in accordance with the synchronization signal, where the synchronization signal indicates a relative position of an external output signal. The parameter is one of a frequency or a frequency offset and includes a plurality of frequencies introduced to the output signal in a predetermined order and timing in accordance with the synchronization signal, or the parameter is one of a reactance or a reactance offset and includes a plurality of reactances introduced in a predetermined order and timing in accordance with the synchronization signal, where the reactance is at least one of a capacitance or an inductance. The non-transitory computer-readable medium instructions may include adjusting the hopping pattern by applying one of an offset or a scaling factor to the hopping pattern, and the offset is adjusted by perturbing the offset to determine an effect on a cost function, generating a composite gradient in accordance with the cost function, and adjusting the respective basis set in accordance with the one of minimizing or maximizing the cost function. The non-transitory computer-readable medium instructions may include adjusting the scaling factor by perturbing a present scaling factor to determine an effect on a cost function, generating a composite gradient in accordance with the cost function, and adjusting the scaling factor in accordance with the one of minimizing or maximizing the cost function. Implementations of the described techniques may include hardware, a method or process, or computer software on a computer-accessible medium.

One general aspect includes a power generator system includes a power source, the power source generating an output signal having a variable amplitude and frequency and a plurality of bins. The system also includes a power controller coupled to the power source, the power controller configured to generate a control signal to vary the output signal, the power controller configured to adjust at least one parameter that determines a characteristic of the output signal in response to a synchronization signal. The parameter is perturbed in accordance with a hopping pattern associated with the plurality of bins, and the parameter is adjusted in accordance with one of minimizing or maximizing a cost function responsive to perturbation of the at least one parameter by the hopping pattern. The hopping pattern is adjusted in accordance with a basis set having a plurality of dimensions and a number of dimensions is fewer than a number of bins. Other embodiments of this aspect include corresponding computer systems, apparatus, and computer programs recorded on one or more computer storage devices, each configured to perform the actions of the methods.

Implementations may include one or more of the following features. The power generator system where more than one of the plurality of bins is adjusted during each iteration. The basis set may include basis functions including at least one of a sinusoid, spline, polynomial, exponential, and radial basis set. A first dimension of the basis set is orthogonal to a second dimension of the basis set. A plurality of the dimensions of the basis set is determined from data analytics. A plurality of the dimensions of the basis set is determined in accordance with singular value decomposition (SVD) or principal component analysis (PCA). The power controller adjusts the parameter in accordance with the synchronization signal, where the synchronization signal indicates a relative position of an external output signal. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

In the drawings, reference numbers may be reused to identify similar and/or identical elements.

DETAILED DESCRIPTION

Figure 1:
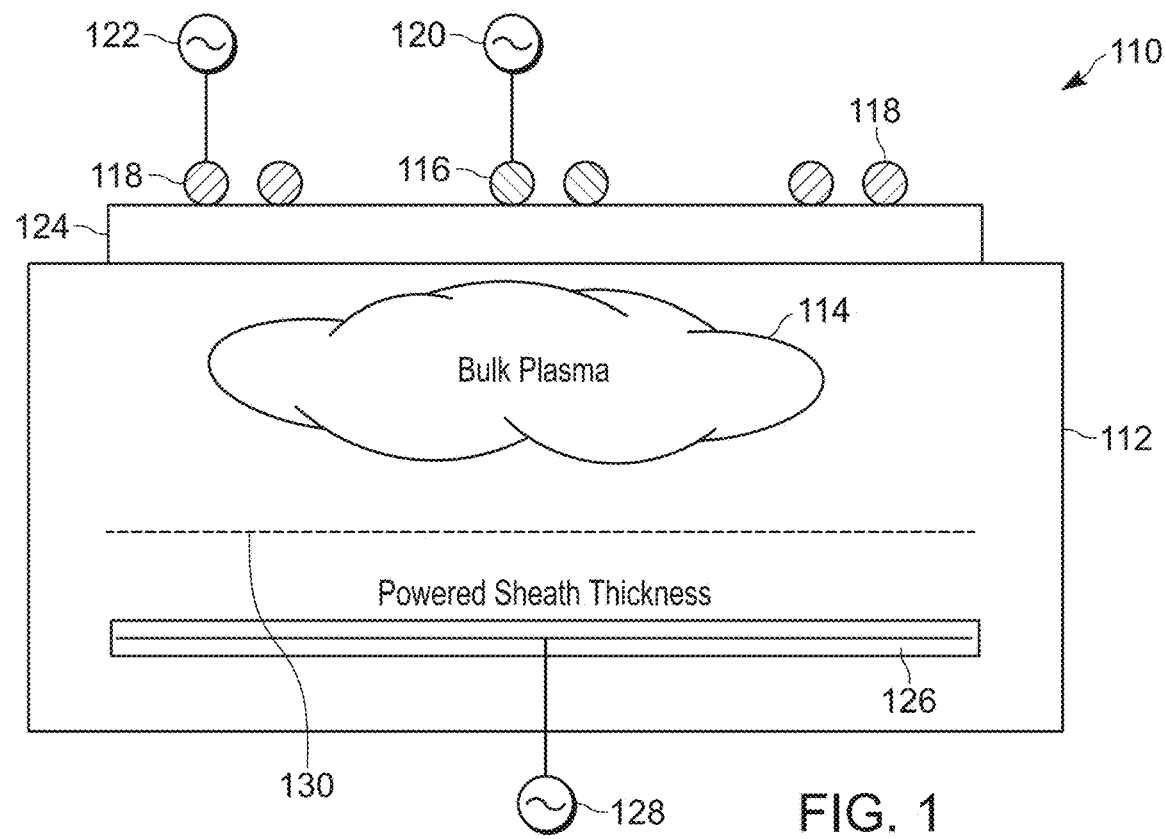
FIG. 1 shows a representation of an inductively coupled plasma processing system.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit transforms a load impedance to a characteristic impedance of a transmission line between the power generator and the matching network. The impedance matching aids in maximizing an amount of power forwarded to the load ("forward power") and minimizing an amount of power reflected back from the load to the power generator ("reverse power" or "reflected power"). Delivered power to the load may be maximized by minimizing reflected power when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse or pulsed mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled sources and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power or voltage. One way of controlling the IEDF for a system in which multiple RF power signals are applied to the load occurs by varying multiple RF signals that are related by at least one of amplitude, frequency, and phase. The related at least one of amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the other power generator (the bias) controls ion energy. Examples of dual power systems include systems that are described in U.S. Pat. Nos. 7,602,127; 8,110,991; and 8,395,322, referenced above. The dual power system described in the above-referenced patents employs a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide process space to support material surface interaction. In one responsive approach in an inductively coupled plasma system, controlling power applied to a source electrode controls the plasma density while controlling power applied to the bias electrode modulates ions to control the IEDF to provide etch rate and etch feature profile control. By using source electrode and bias electrode control, the etch rate and other various etch characteristics are controlled via the ion density and energy.

As integrated circuit and device fabrication continues to evolve, so do the power requirements for controlling the process for fabrication. For example, with memory device fabrication, the requirements for bias power continue to increase. Increased power generates higher and more energetic ions for increased directionality or anisotropic etch feature profiles and faster surface interaction, thereby increasing the etch rate and allowing higher aspect ratio features to be etched. In RF systems, increased ion energy is sometimes accompanied by a lower bias frequency requirement along with an increase in the power and number of bias power sources coupled to the plasma sheath created in the plasma chamber. The increased power at a lower bias frequency and the increased number of bias power sources results in intermodulation distortion (IMD) from a sheath modulation. The IMD emissions can significantly reduce power delivered by the source where plasma generation occurs. U.S. Pat. No. 10,821,542, issued Nov. 3, 2020, entitled Pulse Synchronization by Monitoring Power in Another Frequency Band, assigned to the assignee of the present application, and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts a representation of an inductively coupled plasma (ICP) system 110. ICP system 110 includes a non-linear load, such as a reactor, plasma reactor, or plasma chamber 112, which will be referred to interchangeably herein, for generating plasma 114. Power in the form of voltage or current is applied to plasma chamber 112 via a pair of coils, including a coil assembly that in various configurations includes one or multiple coils arranged in various configurations. In one nonlimiting arrangement shown in FIG. 1, plasma chamber 112 includes one or both a first coil 116 and a second coil 118. In various configurations, multiple coils may be arranged concentrically, intertwined, or in a spiral configuration. Power is applied to first coil 116 via RF power generator or power source 120, and power is applied to second coil 118 via RF power generator or power source 122. Coils 116 and 118 are arranged to provide power to plasma chamber 112. A dielectric window 124 enables power to couple through to the plasma while providing a vacuum seal. A substrate 126 is placed in plasma chamber 112 and typically forms the work piece that is the subject of plasma operations. An RF power generator, power supply, or power source 128 (the terms may be used herein interchangeably) applies power to plasma chamber 112 via substrate 126.

In various configurations, power sources 120, 122 provide a source voltage or current to ignite or generate plasma 114 or control the plasma density. Also in various configurations, power source 128 provides a bias voltage or current that modulates the ions to control the ion potential or ion energy of the plasma 114. In various configurations, power sources 120, 122 are locked to operate at the same frequency, voltage, and current, with fixed or varying relative phases. In various other configurations, power sources 120, 122 may operate at different frequencies, voltages, and currents, and relative phases.

Figure 2:
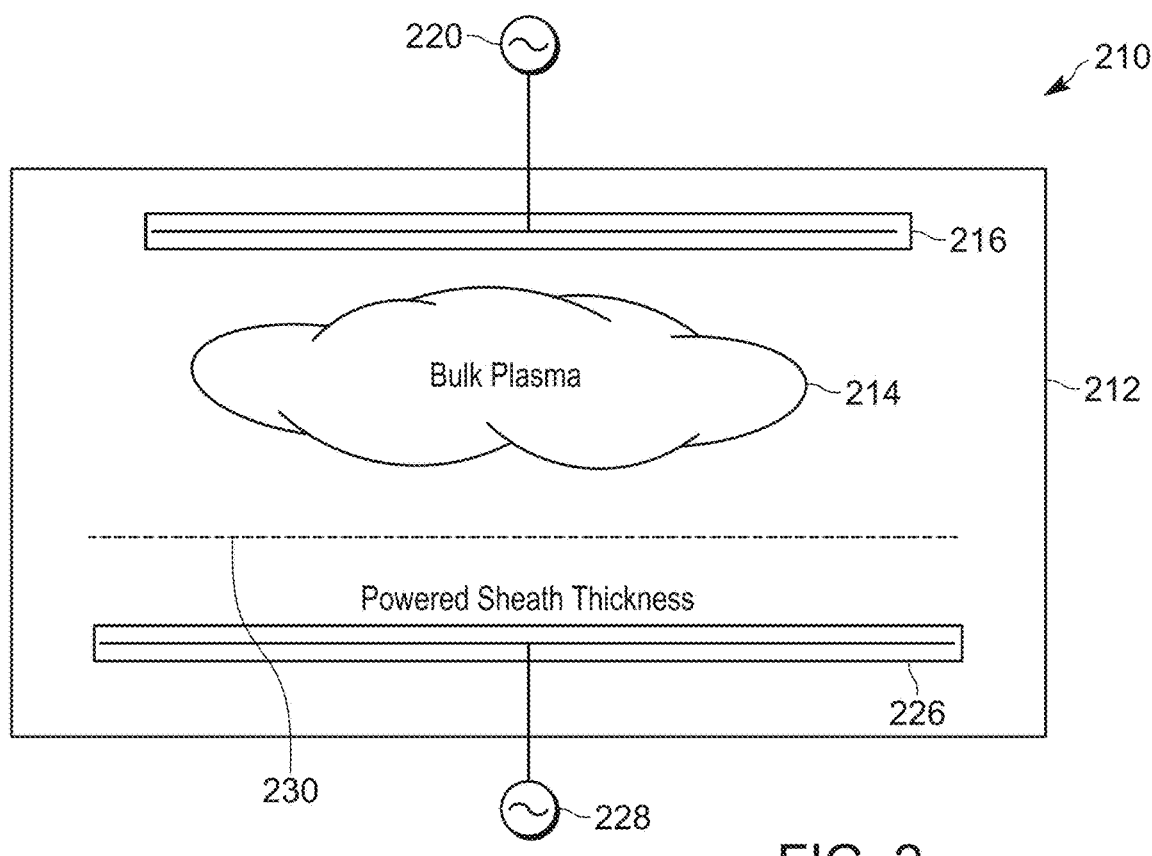
FIG. 2 shows a representation of a capacitively coupled plasma processing system.

FIG. 2 depicts a representation of a capacitively coupled plasma (CCP) system 210. CCP system 210 includes plasma chamber 212 for generating plasma 214. A pair of electrodes 216, 226 placed within plasma chamber 212 connect to respective DC ($\omega=0$) or RF power generators or power sources 220, 228. In various configurations, power source 220 provides a source voltage or current to ignite or generate plasma 214 or control the plasma density, although a bias power source may also be used to ignite a plasma. In various configurations, power source 228 provides a bias voltage or current that modulates the ions in the plasma to control ion potential, ion energy, or ion density of the plasma 214. In various CCP configurations, bias power and source power may be applied to the upper electrode, such as electrode 216, and the lower electrode, such as electrode 226, in various combinations. In another nonlimiting example, bias power and source power may be applied to a lower electrode, such as electrode 226, and the top electrode, such as electrode 216, is grounded or floating. In various RF configurations, power sources 220, 228 operate at relative phases when the sources are harmonically related. In various other configurations, power sources 220, 228 operate at different frequencies, voltages, and currents, with fixed or varying relative phases. Also in various configurations, power sources 220, 228 can be connected to the same electrode, while the counter electrode is connected to ground or to yet a third DC ($\omega$=0) or RF power generator (not shown). In addition to a sinusoidal bias waveform, in various configurations, a non-sinusoidal bias waveform may control ion energy. By way of nonlimiting example, the bias waveform may be a pulsed rectangular waveform or a piecewise linear waveform as described in U.S. Pat. No. 10,396,601, issued on Aug. 27, 2019, entitled Piecewise RF Power Systems and Methods for Supplying Pre-Distorted RF Bias Voltage Signals to an Electrode in a Processing Chamber, assigned to the assignee of the present application, and incorporated by reference herein.

Figure 3:
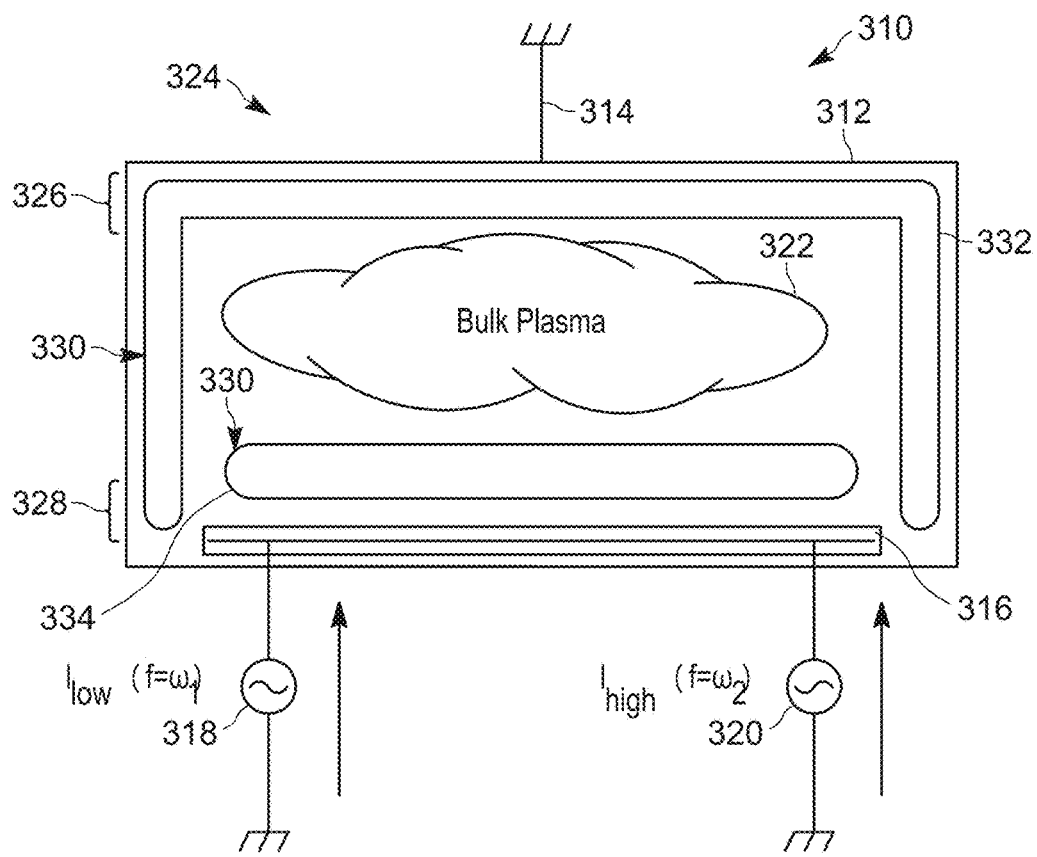
FIG. 3 shows a generalized representation of a plasma system arranged according to various configurations of the present disclosure.

FIG. 3 depicts a cross-sectional view of a generalized representation of a dual power input plasma system 310. Plasma system 310 includes first electrode 312 connected to ground 314 and second electrode 316 spaced apart from first electrode 312. A first DC ($\omega$=0) or RF power source 318 generates a first RF power applied to second electrode 316 at a first frequency f=$\omega_1$. A second power source 320 generates a second DC ($\omega$=0) or RF power applied to second electrode 316. In various configurations, second power source 320 operates at a second frequency f=$\omega_2$, where $\omega_2$=n$\omega$ that is the $n^{th}$ harmonic frequency of the frequency of first power source 318. In various other configurations, second power source 320 operates at a frequency that is not a multiple of the frequency of the first power source 318.

Coordinated operation of respective power sources 318, 320 results in generation and control of plasma 322. As shown in FIG. 3 in schematic view, plasma 322 is formed within an asymmetric sheath 330 of plasma chamber 324. Sheath 330 includes a ground or grounded sheath 332 and a powered sheath 334. A sheath is generally described as the surface area surrounding plasma 322. As can be seen in schematic view in FIG. 3, grounded sheath 332 has a relatively large surface area 326. Powered sheath 334 has a small surface area 328. Because each sheath 332, 334 functions as a dielectric between the conductive plasma 322 and respective electrodes 312, 316, each sheath 332, 334 forms a capacitance between plasma 322 and respective electrodes 312, 316.

As will be described in greater detail herein, in systems in which a high frequency voltage source, such as second power source 320, and a low frequency voltage source, such as first power source 318, intermodulation distortion (IMD) products are introduced. IMD products result from a change in plasma sheath thickness, thereby varying the capacitance between plasma 322 and electrode 312, via grounded sheath 332, and plasma 322 and electrode 316, via powered sheath 334. The variation in the capacitance of powered sheath 334 generates IMD. Variation in powered sheath 334 has a greater impact on the capacitance between plasma 322 and electrode 316 and, therefore, on the reverse IMD emitted from plasma chamber 324. In some plasma systems grounded sheath 332 acts as a RF short circuit and is not considered for its impact on reverse IMD.

Figure 4:
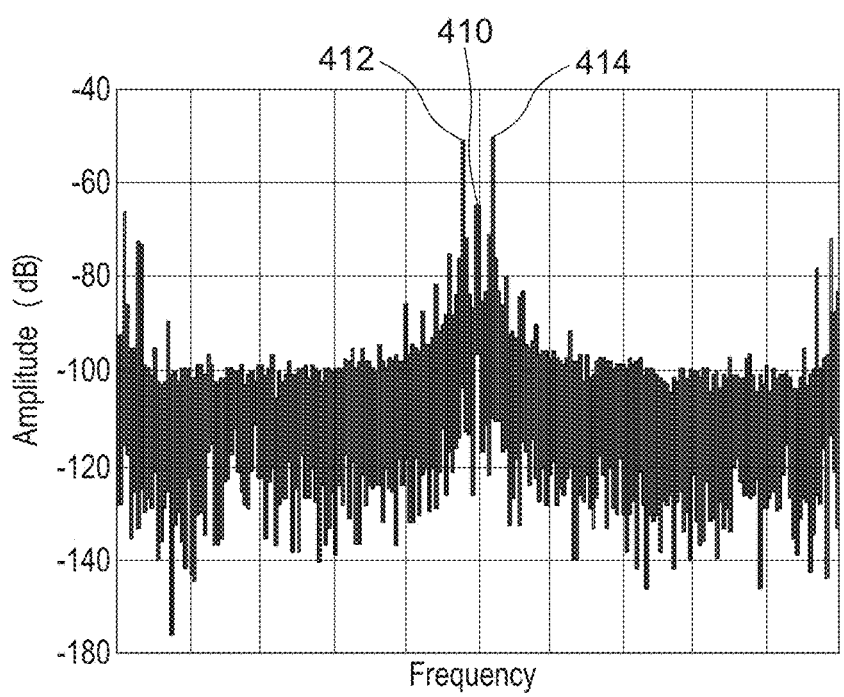
FIG. 4 is an example plot of intermodulation distortion (IMD) resulting from applying two signals of different frequency to a non-linear reactor.

FIG. 4 shows a plot of amplitude versus frequency for an exemplary power delivery system having a low frequency source such as first power source 318, and a high frequency source, such as second power source 320. FIG. 4 shows amplitude of the reflected spectrum of power with respect to frequency for power source 320. FIG. 4 includes a center peak 410 indicating the center frequency of operation of the high frequency power source, such as second power source 320 of FIG. 3. On either side of center peak 410, FIG. 4 also shows IMD components 412, 414 which represent the IMD introduced by the application of power from a low frequency power source, such as first power source 318 of FIG. 3. By way of nonlimiting example, if second power source 320 operates at a frequency of 60 MHz, and low frequency power source 318 operates at 400 kHz, IMD components can be found at 60 MHz+/−n*400 kHz, where n is any integer. Thus, peaks 412, 414 represent the high frequency +/− the low frequency of the respective power supplies. Driving an electrode at multiple harmonics, such as shown in FIG. 3, provides the opportunity to control DC self-bias electrically and to tailor the energetic levels of ion density.

Figure 5:
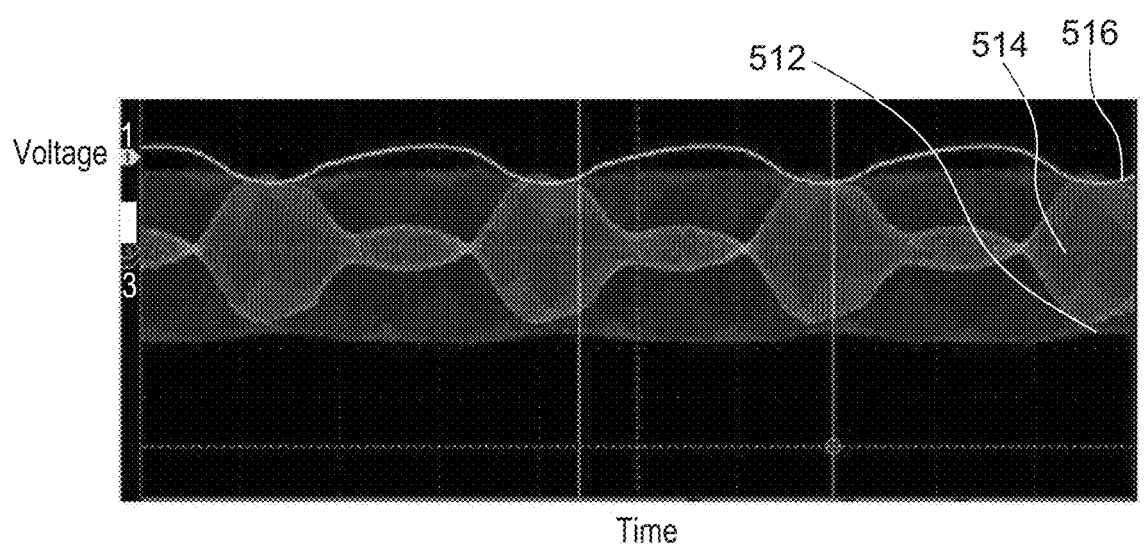
FIG. 5 shows voltage and power waveforms for a system having two RF signals applied to a load and the effect of intermodulation distortion on power delivery to the load.

FIG. 5 shows waveforms of forward voltage 512 and reverse or reflected voltage 514 for a higher frequency or source RF generator. By way of nonlimiting example, the source RF generator may operate at 60 MHz. FIG. 5 also shows a voltage waveform 516 indicating the output voltage of a lower frequency or bias RF generator, operating at, by way of nonlimiting example, 400 KHz. As can be seen in FIG. 5, the reflected voltage 514 of the source RF generator varies in accordance with the voltage fluctuations of voltage waveform 516 of bias RF generator. As can also be seen in FIG. 5, when the reflected voltage 514 increases, the voltage delivered to the load or the reactor (the difference between the forward voltage 512 and the reflected voltage 514) decreases.

Figure 6:
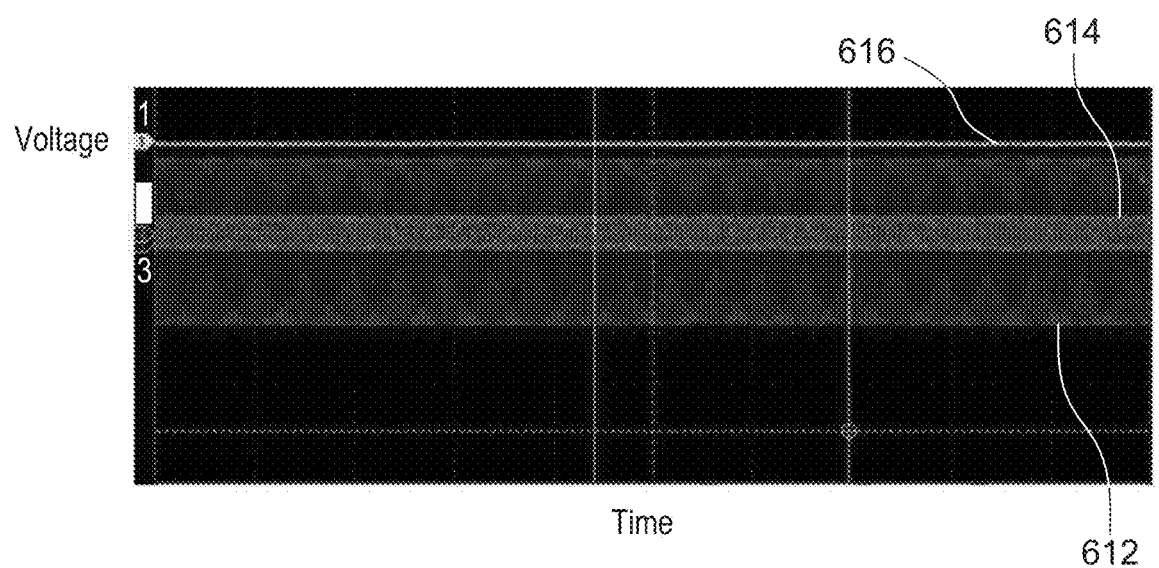
FIG. 6 shows voltage and power waveforms of a system having two RF signals applied to a load and power delivery when no intermodulation distortion between the two signals exists.

In FIG. 6, the voltage 616 output by bias RF generator has an amplitude of zero. When voltage 616 has a generally constant value, reverse or reflected voltage 614 has virtually no fluctuation. Therefore, forward voltage 612 delivered to the load is relatively constant and at a higher amplitude in the absence of fluctuations of reflected voltage 614. In various configurations, voltage 616 may be maintained constant without fluctuations when the bias RF generator is off.

As can be seen from FIGS. 5 and 6, fluctuation of voltage waveform 516 of the bias RF generator causes resultant IMD experienced at the load. The resultant IMD causes fluctuations in reverse voltage 514, that adversely affect delivery of forward voltage 512. By minimizing IMD, a more consistent forward voltage at a higher amplitude can be delivered to the load or process chamber. It should be understood that while the waveforms described in FIG. 5 and FIG. 6 are voltage waveforms, the principles described therein apply equally with respect to detecting power instead of voltage.

Various approaches to responding to IMD-related load variations, such as shown in FIG. 5, include configuring the source RF generator to provide a higher output voltage to the load. A voltage increase will not improve the efficiency of the system and requires components selected to operate at the higher voltage levels. When operating at such higher voltage levels, other RF generator components must be selected not only to apply a greater forward voltage, but also to withstand higher reflected voltage levels. Thus, increasing voltage results in a higher RF generator cost.

Other approaches to addressing IMD-related load variations include implementing a disturbance cancellation system that adjusts the frequency actuator of the source RF generator in synchronization with operation of the bias RF generator. Since operation of the bias RF generator is typically periodic, adjustment of the frequency actuator of the source RF generator can be synchronized with the frequency of the lower frequency generator. An example of such an approach can be found with respect to U.S. Pat. No. 9,947,514, issued Apr. 17, 2018 and entitled Plasma RF Bias Cancellation System, assigned to the assignee of the present application, and incorporated by reference herein.

Another disturbance cancellation system is implemented by controlling actuators that affect matching network reactance, an example of which can be found with respect to U.S. Pat. No. 11,232,931, issued Jan. 25, 2022, entitled Intermodulation Distortion Mitigation Using Electronic Variable Capacitor, assigned to the assignee of the present application, and incorporated by reference herein. A further approach can be found with respect to controlling actuators such as power amplifier drive control, an example of which can be found with respect to U.S. Pat. No. 11,158,488, issued Oct. 26, 2021, entitled High Speed Synchronization of Plasma Source/Bias Power Delivery, assigned to the assignee of the present application, and incorporated by reference herein.

Returning to a disturbance cancellation system implemented by adjusting the frequency actuator of the source RF generator described above, disturbance cancellation requires tuning the frequency actuator profile. Such a profile may be generally described as a hopping pattern, adjustment pattern, or correction pattern since the frequency of the source RF generator changes in synchronization with the frequency of the bias RF generator. The approach may be generally described as frequency hopping.

Traditionally, frequency hopping or adjustment patterns were derived using manual tuning of the frequency profile via an iterative approach using a graphical user interface. Such an approach lacks efficiency and does not enable responding to disturbances that occur during the course of normal system operation, since the pattern is tuned in advance of the fabrication process occurring within the process or plasma chamber.

Figure 7:
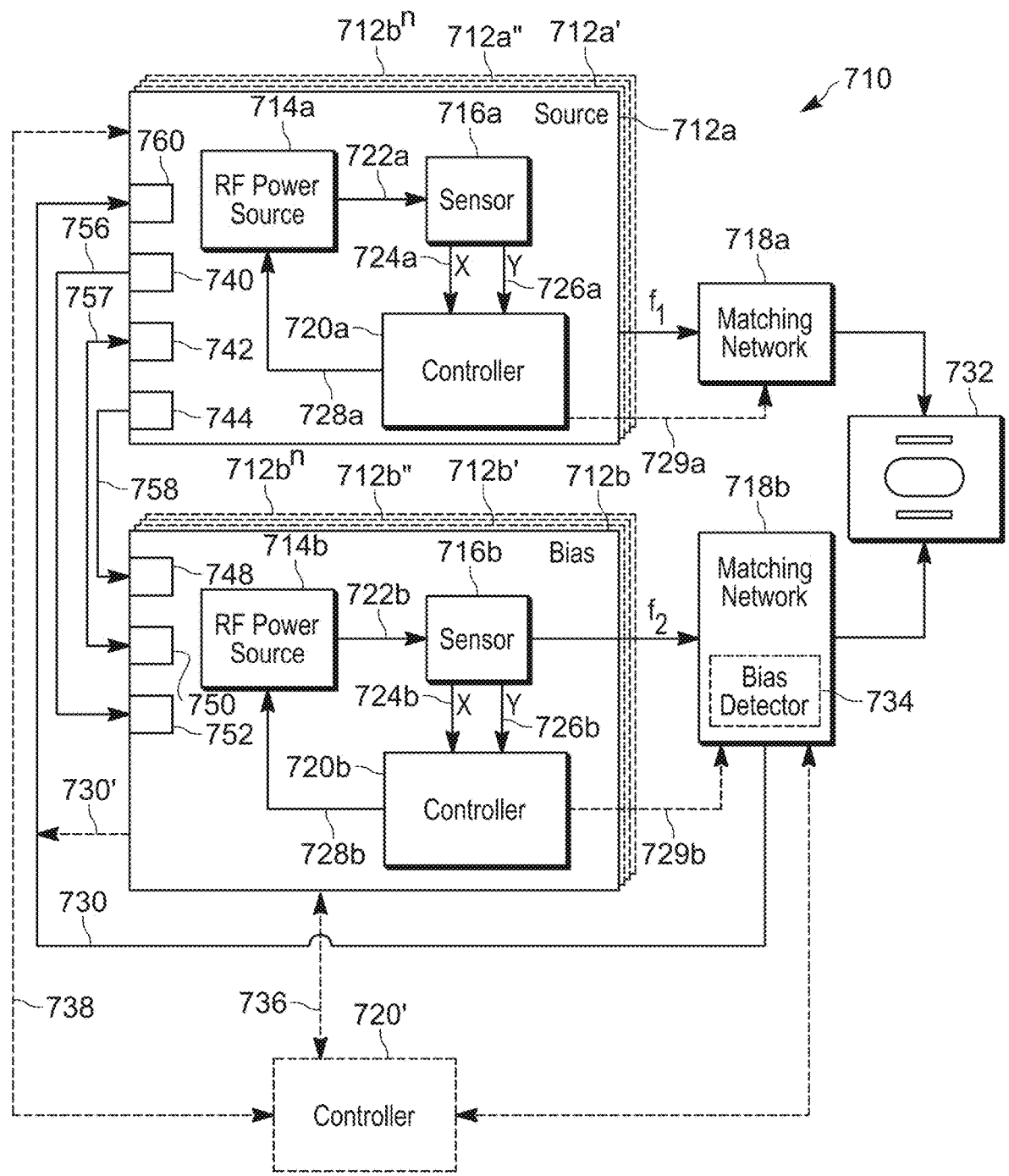
FIG. 7 is a schematic block diagram of a power delivery system having multiple power supplies arranged according to various configurations of the present disclosure.

FIG. 7 depicts a RF generator or power supply system 710. Power supply system 710 includes radio frequency (RF) generators or power supplies 712a, 712b, matching networks 718a, 718b, and load 732, such as a non-linear load, which may be a plasma chamber, plasma reactor, process chamber, and the like. In various configurations, RF generator 712a is referred to as a source RF generator or power supply, and matching network 718a is referred to as a source matching network. Also in various configurations, RF generator 712b is referred to as a bias RF generator or power supply, and matching network 718b is referred to as a bias matching network. It will be understood that components can be referenced individually or collectively using the reference number with or without a letter subscript or a prime symbol. In various configurations, one or both of matching networks 718a, 718b may be implemented as a RF blocking filter, rather than an impedance match, such as may be the case for a matching network receiving a pulsed DC or non-sinusoidal signal. In various other configurations, one or both of matching networks 718a, 718b may be omitted.

In various configurations, source RF generator 712a receives a control signal 730 from matching network 718b, generator 712b, or a control signal from bias RF generator 712b. Control signals 730 or 730' represent an input signal to source RF generator 712a that indicates one or more operating characteristics or parameters of bias RF generator 712b. In various configurations, a synchronization bias detector 734 senses the RF signal output from matching network 718b to load 732 and outputs synchronization or trigger signal 730 to source RF generator 712a. In various configurations, synchronization or trigger signal may be output from bias RF generator to source RF generator, rather than trigger signal 730. A difference between trigger or synchronization signals 730, 730' may result from the effect of matching network 718b, which can adjust the phase between the input signal to and output signal from matching network. Signals 730, 730' include information about the operation of bias RF generator 712b that in various configurations enables predictive responsiveness to address periodic fluctuations in the impedance of plasma chamber 732 caused by the bias RF generator 712b. When control signals 730 or 730' are absent, RF generators 712a, 712b operate autonomously.

RF generators 712a, 712b include respective RF power sources or amplifiers 714a, 714b, RF sensors 716a, 716b, and processors, controllers, or control modules 720a, 720b. RF power sources 714a, 714b generate respective RF power signals 722a, 722b output to respective sensors 716a, 716b. RF power signals 722a, 722b pass through sensors 716a, 716b and are provided to matching networks 718a, 718b as respective RF power signals $f_1$ and $f_2$. Sensors 716a, 716b output signals that vary in accordance with various parameters sensed from load 732. While sensors 716a, 716b, are shown within respective RF generators 712a, 712b, RF sensors 716a, 716b can be located externally to RF generators 712a, 712b. Such external sensing can occur at the output of the RF generator, at the input of an impedance matching device located between the RF generator and the load, or between the output of the impedance matching device (including within the impedance matching device) and the load.

Sensors 716a, 716b detect various operating parameters and output signals X and Y. Sensors 716a, 716b may include voltage, current, and/or directional coupler sensors. Sensors 716a, 716b may detect (i) voltage V and current I and/or (ii) forward power $P_{FWD}$ output from respective power amplifiers 714a, 714b and/or RF generators 712a, 712b and reverse or reflected power $P_{REV}$ received from respective matching networks 718a, 718b or load 732 connected to respective sensors 716a, 716b. The voltage V, current I, forward power $P_{FWD}$, and reverse power $P_{REV}$ may be scaled, filtered, or scaled and filtered versions of the actual voltage, current, forward power, and reverse power associated with the respective power sources 714a, 714b. Sensors 716a, 716b may be analog or digital sensors or a combination thereof. In a digital implementation, the sensors 716a, 716b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 716a, 716b generate sensor signals X, Y, which are received by respective controllers or control modules 720a, 720b. Power control modules 720a, 720b process the respective X, Y signals 724a, 726a and 724b, 726b and generate one or a plurality of feedforward or feedback control signals 728a, 728b to respective power sources 714a, 714b. Power sources 714a, 714b adjust RF power signals 722a, 722b based on the received one or plurality feedback or feedforward control signal. In various configurations, power control modules 720a, 720b may control matching networks 718a, 718b, respectively, via respective control signals 729a, 729b based on, for example, X, Y signals 724a, 726a and 724b, 726b. Power control modules 720a, 720b may include one or more proportional-integral (PI), proportional-integral-derivative (PID), linear-quadratic-regulator (LQR) controllers or subsets thereof and/or direct digital synthesis (DDS) component(s) and/or any of the various components described below in connection with the modules.

In various configurations, power control modules 720a, 720b may include functions, processes, processors, or sub-modules. Control signals 728a, 728b may be control or actuator drive signals and may communicate DC offset or rail voltage, voltage or current magnitude, frequency, and phase components, and the like. In various configurations, feedback control signals 728a, 728b can be used as inputs to one or multiple control loops. In various configurations, the multiple control loops can include a proportional-integral (PI), proportional-integral-derivative (PID) controllers, linear-quadratic-regulator (LQR) control loops, or subsets thereof, for RF drive, and for power supply rail voltage. In various configurations, control signals 728a, 728b can be used in one or both of a single-input-single-output (SISO) or multiple-input-multiple-output (MIMO) control scheme. An example of a MIMO control scheme can be found with reference to U.S. Pat. No. 10,546,724, issued on Jan. 28, 2020, entitled Pulsed Bidirectional Radio Frequency Source/Load, assigned to the assignee of the present application, and incorporated by reference herein. In other configurations, signals 728a, 728b can provide feedforward control as described in U.S. Pat. No. 10,049,857, issued Aug. 14, 2018, entitled Adaptive Periodic Waveform Controller, assigned to the assignee of the present application, and incorporated by reference herein.

In various configurations, power supply system 710 can include controller 720'. Controller 720' may be disposed externally to either or both of RF generators 712a, 712b and may be referred to as external or common controller 720'. In various configurations, controller 720' may implement one or a plurality of functions, processes, or algorithms described herein with respect to one or both of controllers 720a, 720b. Accordingly, controller 720' communicates with respective RF generators 712a, 712b via a pair of respective links 736, 738 which enable exchange of data and control signals, as appropriate, between controller 720' and RF generators 712a, 712b. For the various configurations, controllers 720a, 720b, 720' can distributively and cooperatively provide analysis and control of RF generators 712a, 712b. In various other configurations, controller 720' can provide control of RF generators 712a, 712b, eliminating the need for the respective local controllers 720a, 720b.

In various configurations, RF power source 714a, sensor 716a, controller 720a, and matching network 718a can be referred to as source RF power source 714a, source sensor 716a, source controller 720a, and source matching network 718a, respectively. Similarly in various configurations, RF power source 714b, sensor 716b, controller 720b, and matching network 718b can be referred to as bias RF power source 714b, bias sensor 716b, bias controller 720b, and bias matching network 718b, respectively. In various configurations and as described above, the source term refers to the RF generator that generates a plasma, and the bias term refers to the RF generator that tunes ion potential and the Ion Energy Distribution Function (IEDF) of the plasma. In various configurations, the source and bias RF power supplies operate at different frequencies. In various configurations, the source RF power supply operates at a higher frequency than the bias RF power supply. In various other configurations, the source and bias RF power supplies operate at the same frequencies or substantially the same frequencies.

According to various configurations, source RF generator 712a and bias RF generator 712b include multiple ports to communicate externally. Source RF generator 712a includes pulse envelope synchronization output port 740, digital communication port 742, RF output port 744, and control signal port 760. Bias RF generator 712b includes RF input port 748, digital communication port 750, and pulse synchronization input port 752. Pulse envelope synchronization output port 740 outputs a pulse synchronization signal 756 to pulse synchronization input port 752 of bias RF generator 712b. Digital communication port 742 of source RF generator 712a and digital communication port 750 of bias RF generator 712b communicate via a digital communication link 757. Control signal port 760 of source RF generator 712a receives one or both of control signals 730, 730'. RF output port 744 generates a RF control signal 758 input to RF input port 748. In various configurations, RF control signal 758 is substantially the same as the RF control signal controlling source RF generator 712a. In various other configurations, RF control signal 758 is the same as the RF control signal controlling source RF generator 712a, but is phase shifted within source RF generator 712a in accordance with a requested phase shift generated by bias RF generator 712b. Thus, in various configurations, source RF generator 712a and bias RF generator 712b are driven by substantially identical RF control signals or by substantially identical RF control signal phase shifted by a predetermined amount.

In various configurations, power supply system 710 may include multiple RF source generators 712a and multiple RF bias generators 712b. By way of nonlimiting example, a plurality of source RF generators 712a, 712a', 712a", . . . , 712a" can be arranged to provide a plurality of output power signals to one or more source electrodes of load 732. Similarly, a plurality of bias RF generators 712b, 712b', 712b", . . . , 712b" may provide a plurality of output power signals to a plurality of bias electrodes of load 732. When source RF generator 712a and bias RF generator 712b are configured to include a plurality of respective source RF generators or bias RF generators, each RF generator will output a separate signal to a corresponding plurality of matching networks 718a, 718b, configured to operate as described above, in a one-to-one correspondence. In various other configurations, there may not be a one-to-one correspondence between each RF generator and matching network. In various configurations, multiple source electrodes may refer to multiple electrodes that cooperate to define a composite source electrode. Similarly, multiple bias electrodes may refer to multiple connections to multiple electrodes that cooperate to define a composite bias electrode.

Figure 8:
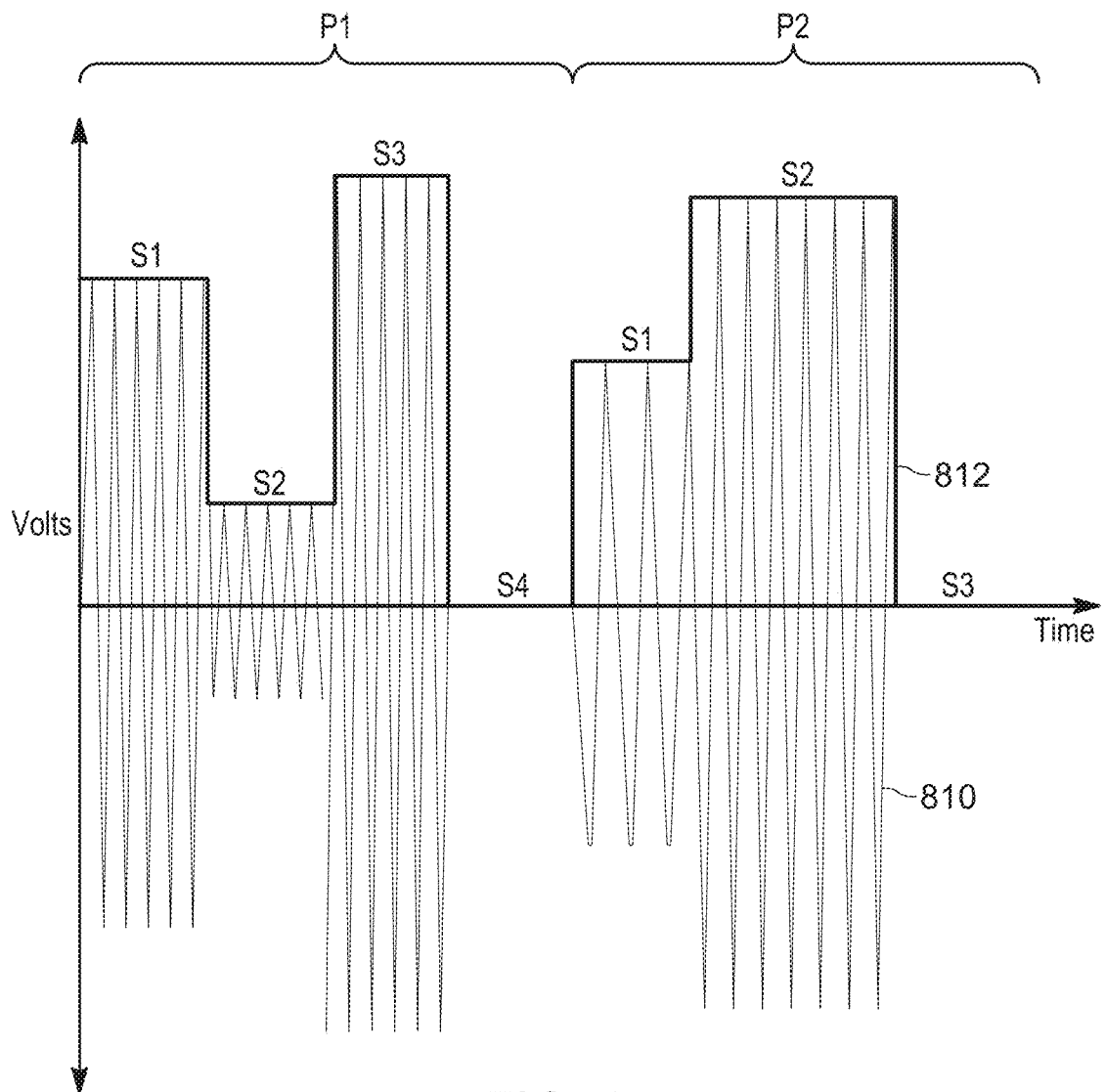
FIG. 8 shows waveforms of a RF signal and a pulse modulating the RF signal.

FIG. 8 depicts a plot of voltage versus time to describe a pulse or pulsed mode of operation for delivering power to a load, such as load 732 of FIG. 7. More particularly, FIG. 8 depicts two-multistate pulses P1, P2 of a pulse signal 812 having a respective plurality of states S1-S4 and S1-S3. In FIG. 8, RF signal 810 is modulated by pulses P1 and P2. As shown at states S1-S3 of P1 and S1-S2 of P2, when the pulses are ON, RF generator 732 outputs RF signal 810 having an amplitude defined by the pulse magnitude at each state. Conversely, during states S4 of P1 and S3 of P2, the pulses are OFF, and RF generator 732 does not output RF signal 810. Pulses P1, P2 can repeat at a constant duty cycle or a variable duty cycle, and states S1-S4, S1-S3 of each respective pulse P1, P2 may have the same or varying amplitudes and widths.

In various configurations, RF signal 810 need not be implemented as a sinusoidal waveform as shown in FIG. 8. As referenced above with respect to FIG. 2, in addition to a sinusoidal waveform, in various configurations, signal 810 may be a non-sinusoidal waveform. By way of non-limiting example, the waveform 810 may be a rectangular waveform pulsed in a repeated or intermittent manner or a piecewise linear waveform as described in U.S. Pat. No. 10,396,601. In various configurations, pulse signal 812 may be other than a square wave as shown in FIG. 8. Further, by way of non-limiting example, an envelope or pulse signal 812 may be a rectangular, trapezoidal, triangular, sawtooth, gaussian, or other shape that defines an envelope or modulating envelope of the underlying, modulated RF signal. In various configurations, the pulse signal may occur or reoccur within fixed or variable periods or time periods. In various other configurations, the pulse signal may vary in shape between each occurrence. In various other configurations, the pulse signal may occur or reoccur within fixed or variable time periods and vary in shape between each occurrence. Further yet, pulses P1, P2 can have multiple states S1, . . . , Sn of varying amplitude, duration, and shape. States S1, . . . , Sn may repeat within fixed or variable periods and may include all or a portion of the various shapes described above. Also shown in FIG. 8, RF signal 810 may operate at frequencies that vary between states or within a state.

The present disclosure is directed to compensating for periodic disturbances caused by variation of an electrical parameter of a RF power delivery system. In RF generator applications, the RF frequency of the signal applied to the load affects the impedance of the load. In various configurations, frequency is used as a control actuator to minimize power reflected from the load back to the RF generator. The RF frequency is varied in order to minimize the reflected power and maximize the forward power delivered to the load.

As discussed above, application of a second RF signal, such as a bias RF generator, which applies a lower frequency RF signal to a load, can impact the power delivered by a first or source RF generator, which typically applies a higher RF frequency to the load. In various disturbance cancellation systems, the period of the lower frequency generator is divided into a selected number or a plurality of bins. In the source RF generator, the RF frequency of the signal output by the source RF generator is adjusted in accordance with the expected disturbance from the periodic signal output by the lower frequency generator. Further, the RF frequency of the source RF generator is adjusted in accordance with each of the bins or plurality of bins of the RF signal output by the lower frequency or bias RF generator. The frequency offsets applied to the RF frequency signal output by the higher frequency or source RF generator defines a hopping pattern intended to reduce or minimize the impact of the load fluctuations caused by the IMD from the RF signal output by the lower frequency or bias RF generator. This approach thus provides a feedforward correction to the RF source frequency actuator, with the bin-by-bin frequency-hopping pattern providing correction values or offsets.

Figure 9:
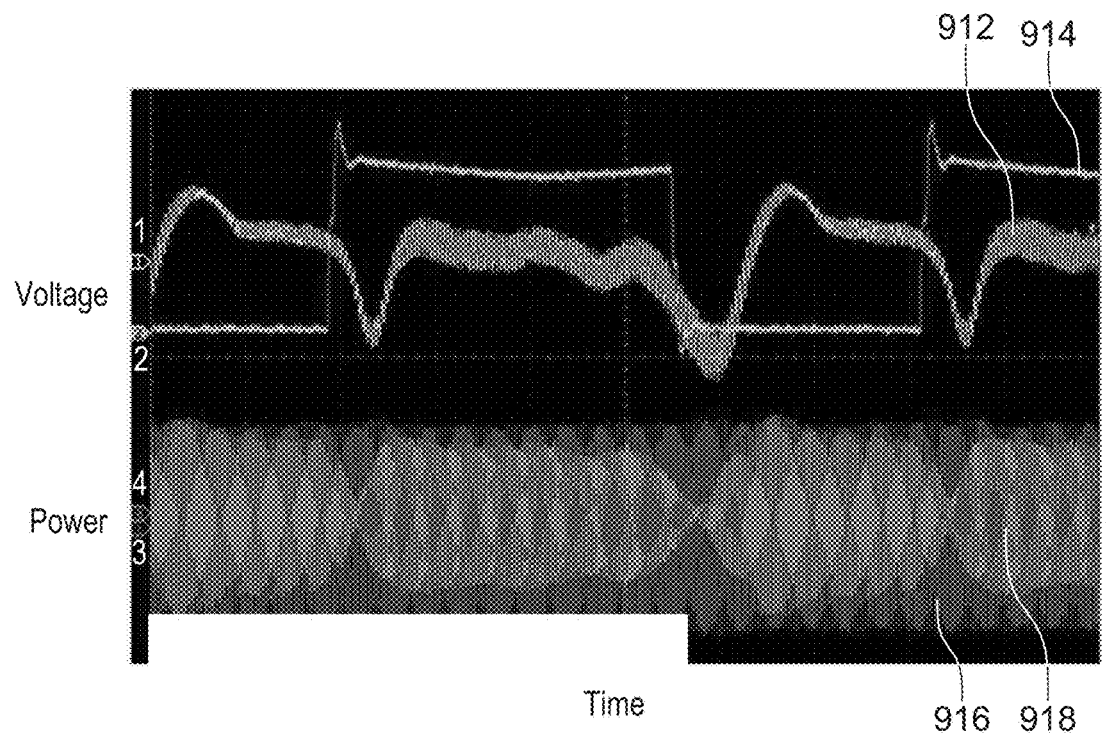
FIG. 9 shows voltage and power waveforms for a system having two RF signals applied to a load in which no periodic disturbance compensation is applied.

FIG. 9 discloses waveforms corresponding to voltage and power of RF generators that generate RF signals applied to a common load, such as a plasma chamber or a reactor. Waveform 912 represents a signal related to the RF signal output by a bias RF generator. By way of nonlimiting example, the bias RF generator operates at 400 KHz. Waveform 914 is a generally square wave synchronization pulse that varies in accordance with the RF signal output by the bias RF generator. Waveform 916 represents a forward power output by a source RF generator output to a load, such as load 732 of FIG. 7. Waveform 918 indicates power reflected back from the load. By way of nonlimiting example, the source RF generator operates at 60 MHz.

Figure 10:
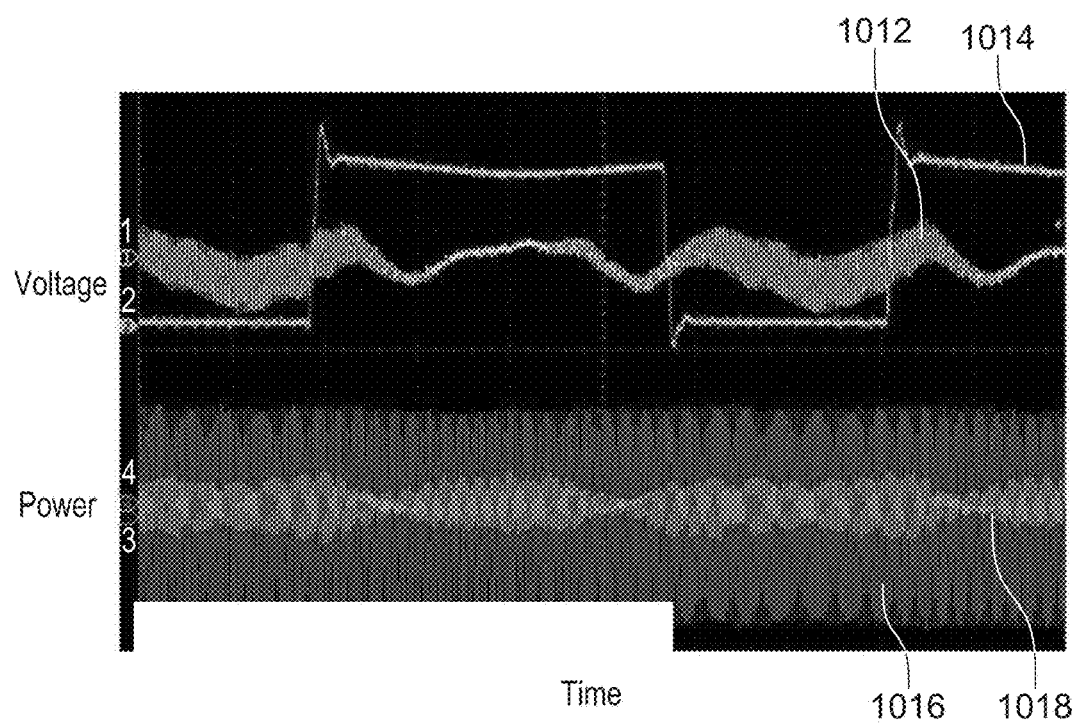
FIG. 10 shows voltage and power waveforms of a system having two RF signals applied to a load in which periodic disturbance compensation is applied.

With reference to FIG. 10, FIG. 10 shows similar waveforms from FIG. 9 with the RF signal output by the source RF generator 712a of FIG. 7, for example, adjusted using a frequency hopping or correction pattern. As described above, waveform 1012 indicates a forward voltage output by bias RF generator 712b of FIG. 7, for example. Similar to FIG. 9, waveform 1014 represents a synchronization pulse related to the output of the RF signal from a bias RF generator such as RF generator 712b. As can be seen in FIG. 10, application of frequency offsets to the output from RF generator 712a significantly reduces reverse power 1018 and increases power delivered to the load or reactor (the difference between the forward power 1016 and the reverse power 1018). Thus, using disturbance cancellation described herein, reflected power 1018 is reduced and delivered power is increased.

In various configurations, a challenge to disturbance cancellation is how to determine the required frequency offset, adjustment, or correction actuations for implementing a frequency hopping, adjustment, or correction pattern. Various approaches describe an extremum seeking iterative learning control (ILC) approach to determine a frequency actuation profile, or hopping pattern, to mitigate the effects of IMD from periodic load impedance variation.

Figure 11:
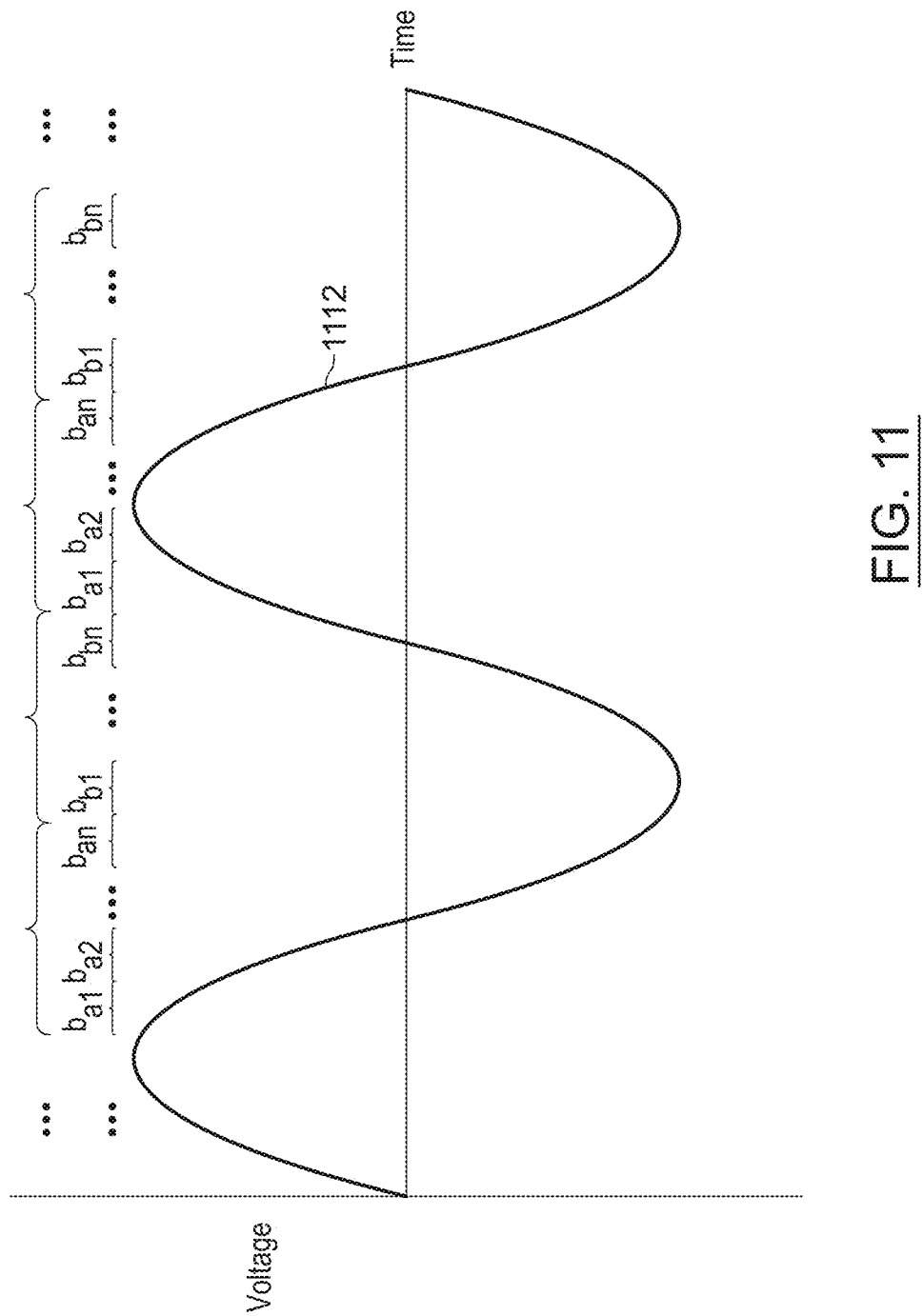
FIG. 11 shows a waveform subdivided into bins to describe periodic disturbance compensation system described herein.

FIG. 11 shows a waveform 1112 of voltage versus time for a RF signal output by a higher frequency or source RF generator, such as RF generator 712a of FIG. 7. Waveform 1112 includes a first section 1124 and a second section 1126. In various aspects, sections 1124, 1126 can be further divided into bins $b_x$, where x generically denotes any bin of the plurality. As shown in FIG. 11, section 1124 is subdivided into bins, such as bins $b_{a1}$, $b_{a2}$, . . . , $b_{an}$. Similarly, section 1126 can be subdivided into bins $b_{b1}$, $b_{b2}$, . . . , $b_{bn}$. In various configurations, both the width and the number of bins within each section 1124, 1126 and between each section 1124, 1126 can vary. The width of each bin within section 1124 may be the same width or varying widths. Likewise, the width of each bin of section 1126 may be the same width or varying widths. Further, the number of bins that comprise section 1124 and the number of bins that comprise section 1126 can vary. For pulsed implementations, the bin width may be narrow for bins in proximity to a pulse edge and wider over a relatively steady state portion of a pulse.

In various configurations, any or one of bins $b_x$ can define segments of a pattern of electrical parameter hops, adjustments, or corrections that define a parameter hopping, adjustment, or correction pattern to control, by way of nonlimiting example, frequency of the source RF generator or other electrical parameter actuations that mitigate or reduce IMD or otherwise improve operation of a RF generator system. Such parameters can include frequency, amplitude, and phase of the RF signal output by the RF generator, such as RF generator 712a of FIG. 7, match network control parameters, and other control parameters. Other parameters can include various actuators in a RF power delivery system, such as reactances including inductance and capacitance in a matching network. Control of such reactances may be implemented using electronically variable capacitances or inductances. In various configurations, the width of a bin $b_x$ may be selected so that the bin spacing is small compared to the fastest rate of change in the reflected power profile caused by the IMDs. If the bins are too wide, then only lower frequency content in the IMD profile can be properly corrected. In some configurations, the bin widths may be chosen based on hardware or software requirements that might limit the number of bin values that can be processed and written as frequency offsets from the generator.

In various configurations, the width of sections 1124 or 1126 is determined in accordance with the periodic nature of a signal causing a variation in reflected power in a load driven by waveform 1112. By way of nonlimiting example, in a RF generator system that includes a source RF generator operating at 60 MHz and a bias RF generator operating at 400 KHz, the widths of sections 1124, 1126 may be set in accordance with the period of the 400 KHz bias RF generator output signal. Since the bias RF generator output signal causes a periodic disturbance in the load in the form of IMD, the adjustment pattern formed by bins $b_x$ within sections 1124, 1126 correct for IMD when the patterns are applied to the source RF signal in relation to operation of the bias RF generator. In the example described herein in which the source RF generator operates at 60 MHz and the bias RF generator operating at 400 KHz, the source RF waveform completes approximately 150 cycles over one bias RF waveform. Thus sections 1124, 1126 are not shown to scale relative to waveform 1112.

As will be described herein, each bin will be assigned an offset frequency or frequency adjustment, also referred to a hopping, adjustment, or correction parameter, applied to the RF signal output by source RF generator 712a in synchronization with bias RF waveform 1112 of FIG. 11. The offsets or corrections associated with each bin define a frequency-hopping pattern. The frequency offset or adjustment associated with each bin may be determined as a calibration step and stored in memory or updated continuously. Thus, in various configurations, frequency hopping or adjustment of the source RF frequency is a feed forward control, and the feed forward values within a bin are updated based on measurements taken over one or more prior bias cycles for corresponding bins.

Each bin $b_x$ can define a hopping frequency, frequency offset, adjustment, or correction parameter of the RF signal output by RF generator 712a. The frequency can be selected to vary the impedance match between the RF generator 712a and the load 732 to control power delivered to the load. Further, in various embodiments, bins $b_x$ of FIG. 11 can define adjustment of various electrical parameters of source RF generator of a matching network, such as matching network 718.

Figure 12:
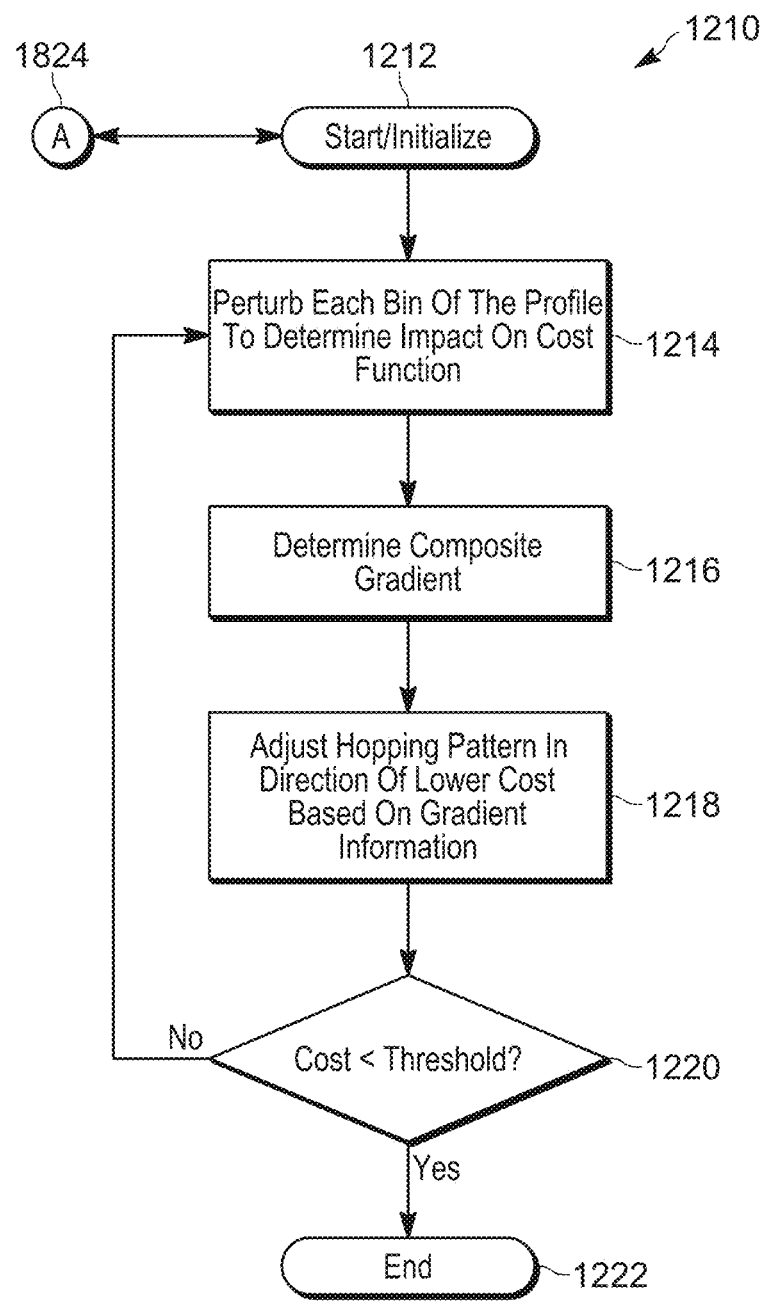
FIG. 12 shows a flow chart of a periodic disturbance compensation system.
Figure 13:
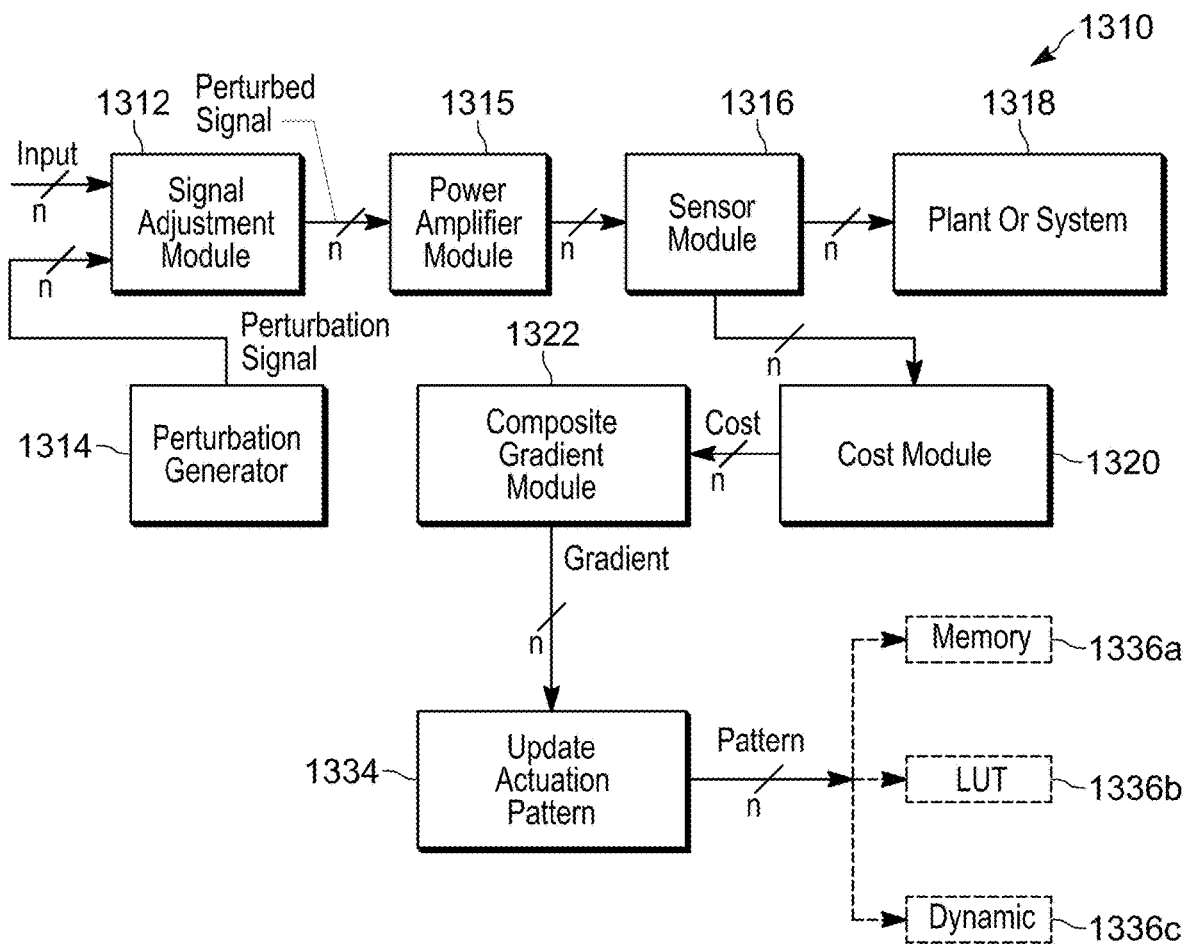
FIG. 13 shows a functional block diagram of a periodic disturbance compensation system.

FIG. 12 shows a flowchart 1210 and FIG. 13 shows a functional block diagram 1310 that describe determining the electrical parameter for each bin of FIG. 11 to determine adjustment of an associated electrical parameter and to determine the adjustment value of the electrical parameter in order to improve operation of a RF generator system. Describing operation of FIGS. 12 and 13 generally, the electrical parameter adjustment or correction profile, such as a frequency hopping profile, is determined iteratively by independently perturbing an actuator value each iteration. In various embodiments, the electrical parameter may be frequency. The independent perturbation involves either increasing or decreasing the actuator related to an electrical parameter each iteration. Each iteration perturbs one or more bins related to the electrical parameter, such as bins $b_x$ described in FIG. 11, and the impact of the perturbation on the output metric or metrics of interest is determined. In various configurations, the output metric or metrics of interest can be one or more of average reflected power, delivered power, or average magnitude of the reflection coefficient over the operating period of the bias generator, such as RF generator 712b of FIG. 7. The metric of interest can also be referred to as a cost function, which is optimized to indicate when a sufficient adjustment pattern has been determined. In various embodiments, the actuator to be perturbed includes one or more of frequency, amplitude, or phase of a signal applied to a load, or a reactance, such as inductance or capacitance, which affects power delivery to a load.

With reference to FIG. 12, control begins at block 1212 and proceeds to block 1214. At block 1214, each bin $b_x$ of the profile is perturbed in order to determine the impact of the perturbation of each bin on a cost function. With reference to FIG. 11, the actuator or actuators corresponding to each bin $b_x$ are perturbed, increased or decreased by a set amount, in order to cause a corresponding variation in the output metric of interest. At block 1214, each of bins $b_x$ of FIG. 11 is varied by a small amount in a similar manner, and the output metric of interest is analyzed to determine the impact of the perturbation on the cost function associated with the metric of interest.

With reference to FIG. 13, functional block diagram 1310 includes a signal adjustment module 1312. Signal adjustment module 1312 receives one or a plurality (n) of input signals. In various embodiments, the one or a plurality (n) of input signals include a signal or signals to be adjusted by the adjustment pattern, such as the RF output from source RF generator. Signal adjustment module 1312 also includes one or a plurality (n) of perturbation signals from perturbation generator 1314. The signal adjustment module outputs one or a plurality (n) of perturbed signals in accordance with the one or a plurality (n) of inputs and the one or a plurality (n) of perturbation signals. Signal adjustment module 1312 can mix, combine, or otherwise process one or a plurality (n) of the input signals and one or a plurality (n) of the perturbation signals to generate one or a plurality (n) of perturbation signals input to power amplifier module 1315. Power amplifier module outputs one or a plurality of power signals in accordance with the plurality (n) of perturbed signals. The one or a plurality (n) of power signals are input to one or a plurality (n) of sensors of sensor module 1316 and also output to plant or system 1318. The perturbed signals applied to plant or system 1318 may cause variation in the output metric or metrics of interest determined by sensor or sensors of sensor module 1316. Sensor module 1316 outputs one or a plurality (n) of sensed values to cost module 1320. Cost module 1320 determines one or a plurality (n) of costs as will be described herein. FIGS. 12 and 13 describe an extremum seeking iterative learning control (ILC) approach to learn the frequency actuation profile or hopping pattern required to mitigate the periodic load variation.

Returning to FIG. 12, control proceeds to block 1216 which determines a composite gradient for the variation in the cost function. With reference to FIG. 12, composite gradient module 1322 receives the one or a plurality (n) of costs and determines a composite gradient at block 1218. Actuator updates $u_i(k+1)$ are determined based on a gradient of the one or a plurality (n) of cost functions gradient. The actuator updates $u_i(k+1)$ can be determined using the gradient descent method described below with respect to Equation (1):

$$u_i(k+1) = u_i(k) - \mu G_i \qquad (1)$$

where:
$u_i$ is the frequency actuation at bin i,
$G_i$ is the measured cost gradient resulting from perturbing bin i,
$\mu$ is a tunable learning rate, and
k is the iteration index.

The measured cost gradient is the slope of the change from a baseline due to injection of the perturbation signal. That is, the measured cost gradient is a difference between output from sensor module 1316 based upon no perturbation signal applied to signal adjustment module 1312, and the output from sensor module 1316 based upon a perturbed input signal applied to signal adjustment module 1312 divided by the actuator change. Because the gradient points in the direction of an increase, the negative sign in Equation (1) insures that the iterations progress toward minimizing cost.

Referring to FIG. 12 at block 1216, $G_i$ of Equation (1) can be determined using various approaches. In one approach, the bin actuator value, such as the one or a plurality (n) of perturbed signals output by signal adjustment module 1312, can be adjusted in one direction and the difference in the cost metric between the baseline (unperturbed) value and the perturbed value can be used to estimate the local gradient $\hat{G}_i$ to determine an actuator response slope as described below in Equation (2):

$$\hat{G}_i = \frac{(C_{pert} - C_{base})}{U_{pert}} \quad (2)$$

where:
$C_{pert}$ is the cost with the perturbation injected,
$C_{base}$ is the cost without the perturbation injected, and
$U_{pert}$ is the perturbation amplitude.

The measured cost gradient is the difference between the unperturbed output metric and the perturbed output metric divided by the amount of perturbation.

In other approaches, the actuator can be adjusted up and adjusted down, or in a first direction and in an opposite direction, to estimate a local gradient $\hat{G}_i$ as described below in Equation (3).

$$\hat{G}_i = \frac{(C_{up} - C_{down})}{2U_{pert}} \quad (3)$$

where:
$C_{up}$ is the cost of the bin actuator increased (perturbed) by a fixed amount,
$C_{down}$ is the cost with the bin actuator decreased (perturbed) by the same fixed amount, and
$U_{pert}$ is the magnitude of the actuator change.

The approach of Equation (3) is more robust with respect to local non-linearities, such as quadratic cost function shapes, than the single direction perturbation method described above with respect to Equation (2).

Other methods for estimating the local gradient may be used. In one nonlimiting example, a second-order polynomial can be fit to the output values or costs using the baseline, $C_{up}$, and $C_{down}$, cost values used in their associated bin actuations. The second order polynomial can then be used to calculate the estimated slope at the center actuator value. If the second order polynomial suggests that a local minimum of the cost function occurs, then the value of the actuator associated with that minimum value can be estimated directly.

Returning to FIG. 12, control proceeds to block 1218 which determines the hopping pattern in direction of lower costs based on gradient information $\hat{G}_i$ obtained at block 1216. The adjustment or hopping pattern is thus adjusted in accordance with Equation (1) described above. Control then proceeds to block 1220, which determines if the cost is less than a predetermined threshold. If the cost is not less than the predetermined threshold, control proceeds to block 1214 in order to perform another iteration of perturbation at block 1214, cost gradient determination at block 1216, and adjustment of the parameter adjustment or correction pattern at block 1218. If the cost is less than a predetermined threshold as determined at block 1220, control proceeds to end at block 1222.

Returning to FIG. 13 at cost module 1322, following determination of the composite gradient, the composite gradient is output to update module 1334 which determines the actuator updates as shown in Equation (1) in accordance with the composite gradient determined at composite gradient module 1332. The composite gradient $\hat{G}$ may be represented as a vector associated with bin actuators i, where $\hat{G}=[G_1, G_2, \ldots, G_n]$. Update module 1334 outputs a parameter adjustment pattern or hopping pattern to one or more of memory 1336a, look up table (LUT) 1336b, or dynamically the adjustment pattern as shown at 1336c. The parameter adjustment pattern can adjust one or a plurality (n) of actuators to control one or a plurality of costs in accordance with a MIMO approach to parameter adjustment. The parameter adjustment values in the parameter correction pattern may indicate a parameter offset value or the parameter value.

Returning to block 1214 of FIG. 12 and cost module 1320 of FIG. 13, the cost function can be determined using various approaches. In one approach, the cost is the average of a measured value, such as reflected power over the period of the lower frequency generator. In various other approaches, the cost function metric may be the average magnitude of the reflection coefficient over the period of the lower frequency generator, such as low frequency or bias generator 712b of FIG. 7. In various other approaches, the cost may vary in accordance with delivered power or the magnitude of the reflection coefficient. In addition to averaging, other metrics for reflected power or average magnitude can be used, including maximum, minimum, or other statistical analysis of such values.

One generalized representation of the cost function may include individually weighted terms for a different cost component as described below in Equation (4):

$$C_{total} = \sum_j W_j C_j \quad (4)$$

Where, $C_j$ and $W_j$ values represent cost components and individual weights assigned to the cost components, respectively. That is, $C_{total}$ can be described as the sum of various weighted cost components, such as measured reflected power or magnitude of a reflection coefficient at negative and positive zero crossings of the lower frequency or bias RF signal can be summed into the cost function. That is, the measured reflected power or the magnitude of the reflection coefficient at a negative zero crossing may be assigned a first weight and the value of the measured reflected power or magnitude of the reflection coefficient at the negative zero crossing may be assigned the first value and the measured reflected power or magnitude of the reflection coefficient at a positive zero crossing may be assigned a second cost value at a second weight.

The cost function can also include additional terms to improve the smoothness of the actuator profile across the full correction or hopping pattern as described below with respect to Equation (5):

$$C_{total} = W_{avg}C_{avg} + W_{neg}C_{neg} + W_{pos}C_{pos} + W_{smooth}C_{smooth} \quad (5)$$

where:

$C_{avg}$ is the average value of the cost, $W_{avg}$ is the weight assigned to the average value of the cost, $C_{neg}$ is the cost at the negative zero crossing of the periodic disturbance or bias RF signal, $W_{neg}$ is the weight assigned to the cost at the negative zero crossing of the bias RF signal, $C_{pos}$ is the cost at the positive zero crossing of the periodic disturbance or bias RF signal, $W_{pos}$ is the weight assigned to the cost at the positive zero crossing of the bias RF signal, $C_{smooth}$ is the cost of the smoothness metric, and $W_{smooth}$ is the weight assigned to the cost of the smoothness metric.

The smoothness metric $C_{smooth}$ can take a number of forms. In one form, the smoothness metric comprises a deviation of the differences of the output metric or cost between consecutive bin actuations. In another form, the smoothness metric $C_{smooth}$ is the sum-square values of the second order differences in the costs or output metric consecutive bin actuations.

Figure 14:
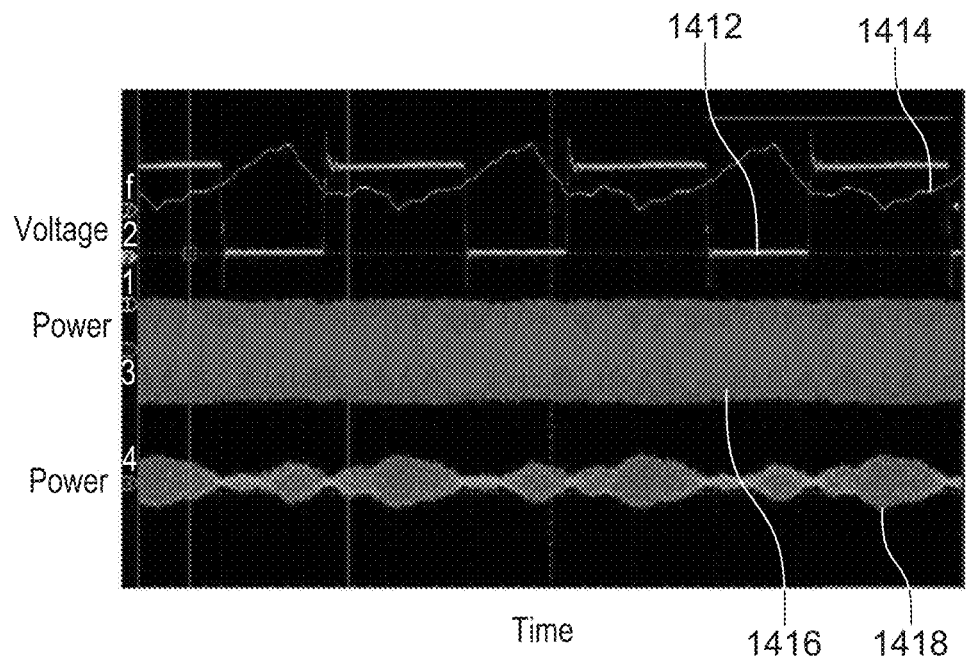
FIG. 14 shows voltage and power waveforms of a system having two RF signals applied to a load where periodic disturbance compensation is applied in accordance with the present disclosure.
Figure 15:
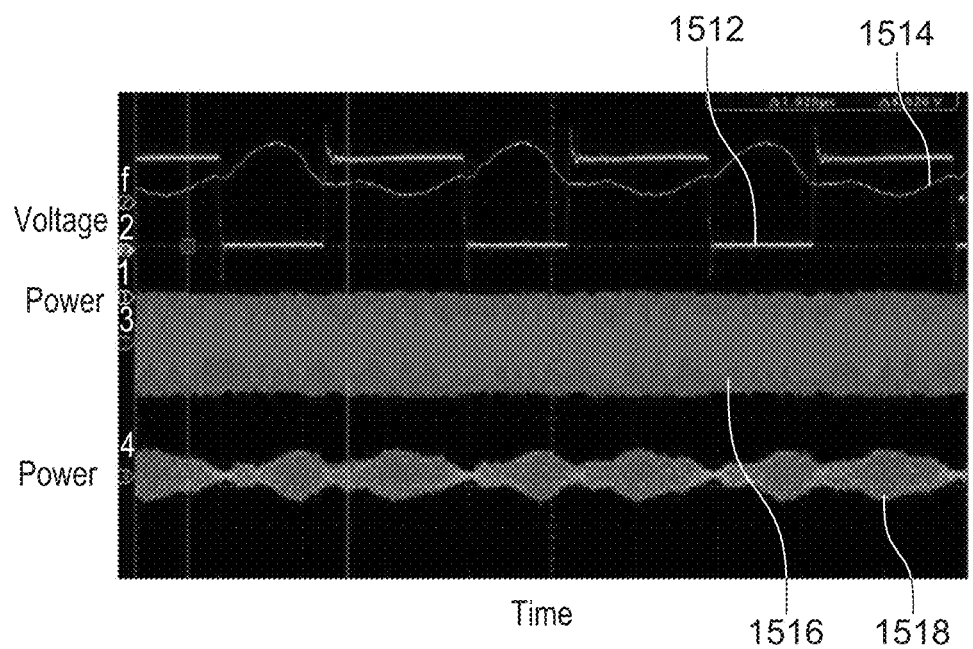
FIG. 15 shows voltage and power waveforms of the system of FIG. 14 in which periodic disturbance compensation further includes smoothing transitions between each compensation value.

FIGS. 14 and 15 indicate a difference in responsiveness of the system between a cost function with no smoothing, as shown in FIG. 14, and a cost function with smoothing, as shown in FIG. 15. Waveform 1412 represents a periodic synchronization signal associated with a low frequency or bias RF source, such as RF generator 712b of FIG. 7. Waveform 1414 represents a frequency of the high frequency or source RF generator, such as RF generator 712a of FIG. 7. Waveform 1414 represents a frequency of the source RF generator over time and represents the adjustment pattern, correction pattern, or hopping pattern of RF generator 712a. FIG. 15 depicts waveforms similarly described with respect to FIG. 14, with waveform 1512 indicating a synchronization signal associated with bias RF generator 712b of FIG. 7 and waveform 1514 indicating the actual RF frequency of the source RF generator 712a of FIG. 7. Waveform 1514 indicates a correction pattern or hopping pattern used by the disturbance cancellation system approach to minimize the impact of IMD. As can be seen when comparing FIGS. 14 and 15, waveform 1514 has a smoother appearance than waveform 1414. With respect to both FIGS. 14 and 15, the reflected powers 1418, 1518 are generally similar. However, the additional smoothness in waveform 1514 resulting from applying a smoothing aspect to the cost function provides a smoother actuating profile. Such smoothness in the hopping profile can increase uniformity in the customer process.

Figure 16:
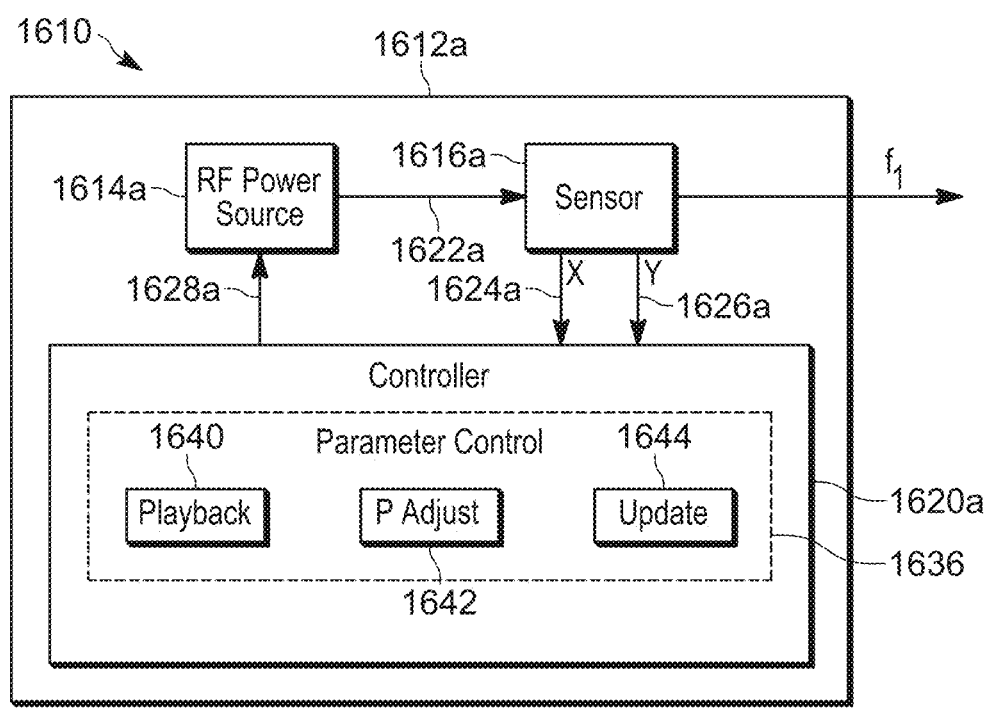
FIG. 16 shows an RF generator configured to compensate for periodic system disturbances.

FIG. 16 depicts an expanded block diagram of a RF generator, such as RF generator 712a of FIG. 7 in which controller 1620a includes amplitude parameter control section 1636. Parameter control section 1636 includes a playback module 1640, a parameter adjustment module 1642, and an update module 1644. Each module 1640, 1642, 1644 can be implemented collectively or individually as a process, a processor, a module, or a submodule. Further, each module 1640, 1642, 1644 can be implemented as any of the various components described below in connection with the term module. Playback module 1640 monitors for a triggering event or signal with which to synchronize the application of parameter corrections, adjustments, or offsets to RF signal $f_1$. The parameter adjustments may include frequency corrections, adjustments, or offsets in a frequency hopping pattern as described above. The corrections, adjustments, or offsets correspond to the n bins. Once playback module 1640 detects a triggering event or signal, playback module 1640 initiates application of parameter adjustments or offsets to RF signal $f_1$. Playback module 1640 cooperates with respective parameter adjustment module 1642. Parameter adjustment module 1642 provides parameter adjustments to respective update module 1644, which coordinates the application of respective parameter adjustments or offsets to RF signal $f_1$. The parameter adjustments may alternatively be one or a number of electrical parameters such as frequency, power, amplitude, phase, impedance matching network settings, and the like.

In various embodiments, parameter adjust module 1642 may be implemented as a lookup table (LUT). The parameter adjustments are determined in accordance with, for example, a timing or synchronization relative to a triggering event or signal. Given the periodic nature of bias RF signal $f_2$ from FIG. 7 and the expected periodic impedance fluctuations that occur in response to application of RF signal $f_2$ to the load 732, a LUT of the adjustments or offsets for RF signal $f_1$ are determined as described above with respect to FIG. 13. The parameter adjustments, offsets, or hops added to RF signal $f_1$ are generated to align with the dynamic impact on the load 732 introduced by RF generator 12b and improve the efficiency through selective and coordinated frequency adjustment by RF source generator 1612a and at least partially cancels the periodic bias signal induced IMD. In various embodiments, the LUT can be predetermined and static during operation or adjusted dynamically with an update process, such as with update module 1644 that implement the ILC approach described above. In various other embodiments, the parameter adjustments can be determined dynamically.

Figure 17:
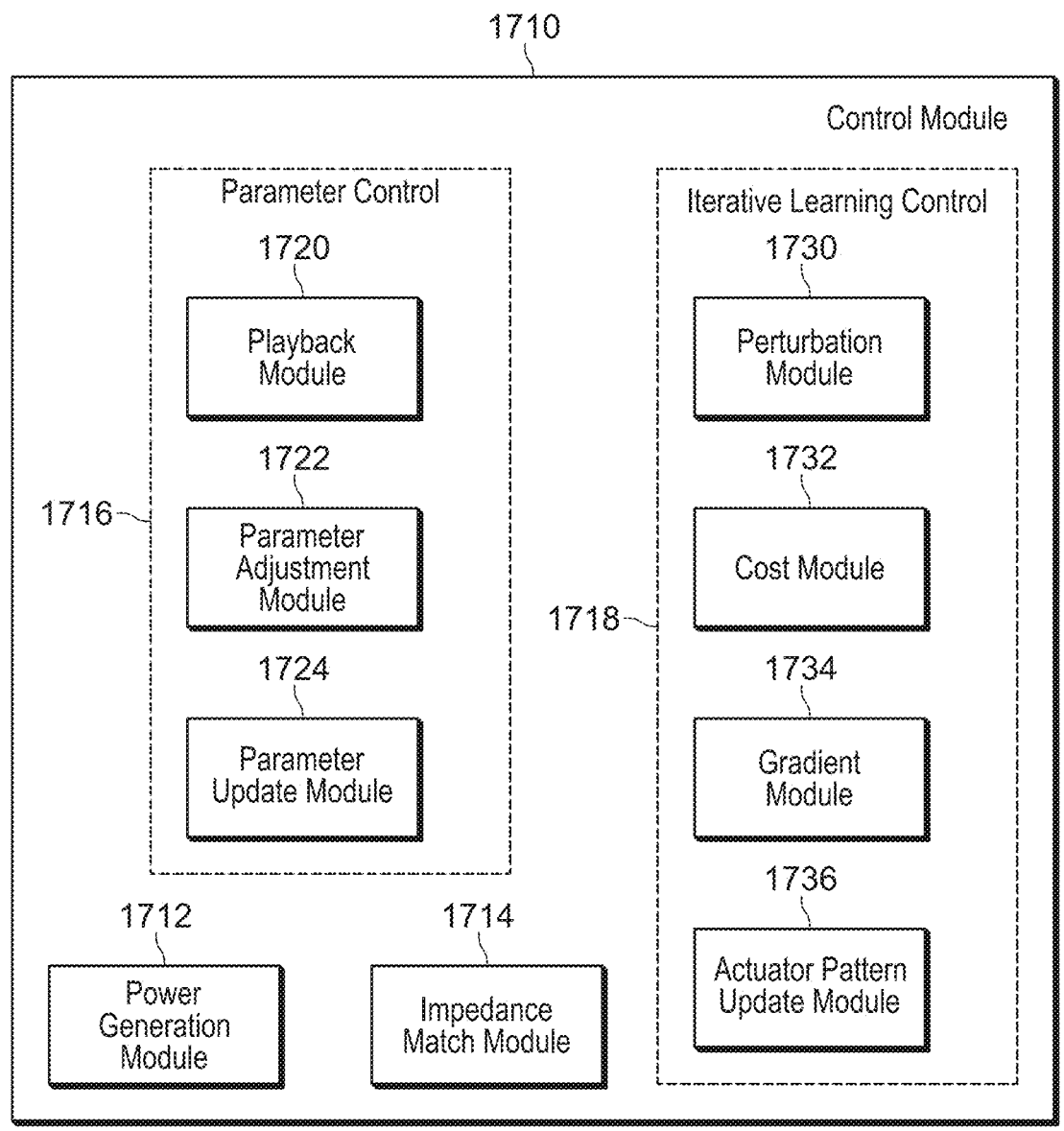
FIG. 17 shows a functional block diagram of an example control module arranged in accordance with various configurations.

FIG. 17 shows a control module 1710. Control module 1710 incorporates various components of FIGS. 2-16. Control module 1710 may include power generation module 1712, impedance match module 1714, parameter control section 1716, and iterative learning control section 1718. Parameter control section 1712 includes playback module 1720, parameter adjustment module 1722, and parameter update module 1724. Iterative learning control section 1718 includes perturbation module 1730, cost module 1732, gradient module 1734, and actuator pattern update module 1736. In various embodiments, control module 1710 includes one or a plurality of processors that execute code associated with the module sections or modules 1712, 1714, 1716, 1718, 1720, 1722, 1724, 1730, 1732, 1734, and 1736. Operation of the module sections or modules 1712, 1714, 1716, 1718, 1720, 1722, 1724, 1730, 1732, 1734, and 1736 is described below with respect to the method of FIG. 18.

Figure 18:
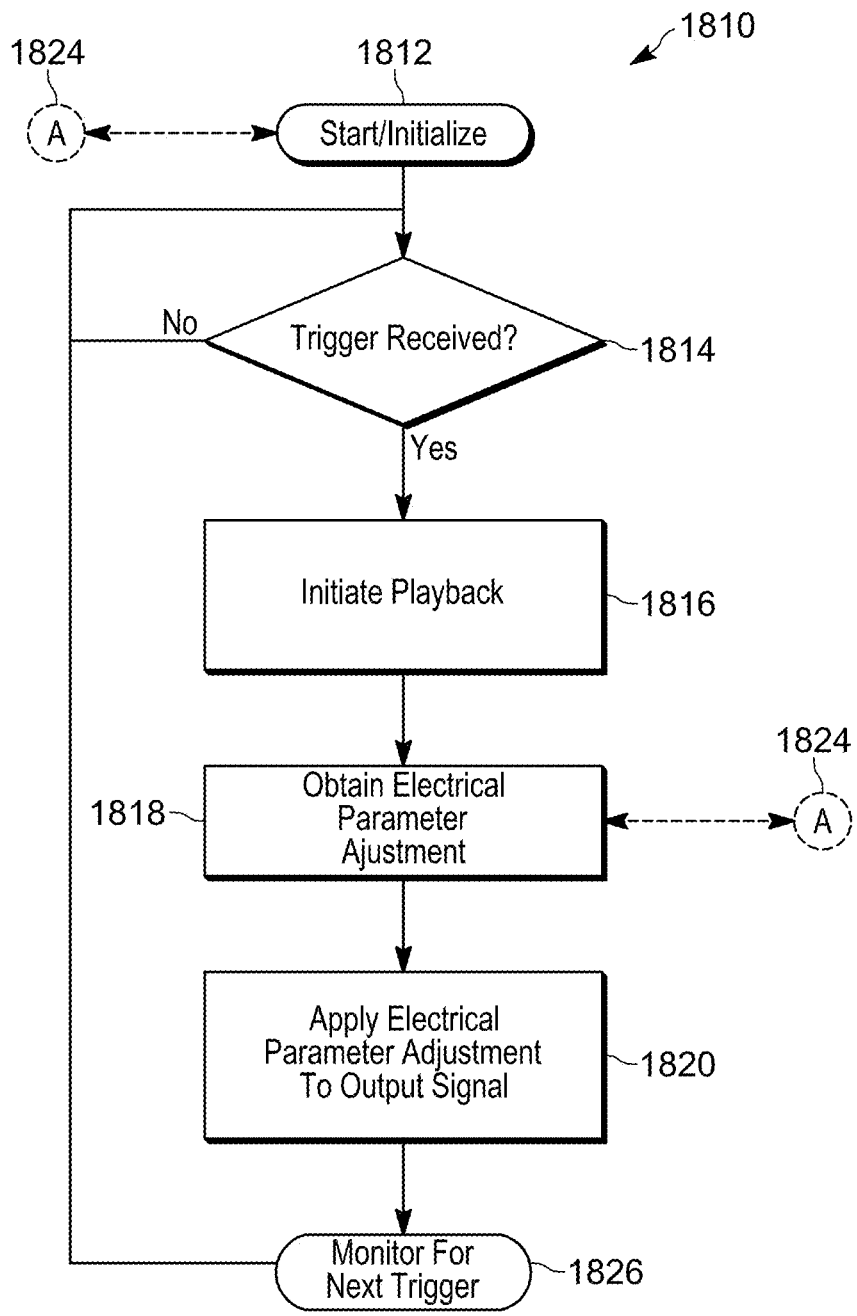
FIG. 18 shows a flow chart of operation of a control system arranged in accordance with the principals of the present disclosure.

For further defined structure of controllers 720a, 720b, and 720', and 1612a of respective FIGS. 7 and 16, see the below provided flow chart of FIG. 18 and the below provided definition for the term "module". The systems disclosed herein may be operated using numerous methods, examples, and various control system methods of which are illustrated in FIG. 18. Although the following operations are primarily described with respect to the implementations of FIGS. 12, 13, and 16, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 18 depicts a flow diagram 1810 of the IMD mitigation system described above. Control begins at block 1812 in which various parameters are initialized. Control proceeds to block 1814 which monitors for a trigger event. A trigger event can be any event which allows suitable alignment of a parameter adjustment, correction, or hopping pattern with RF signal $f_1$ output by RF generator 1612*a*. Block 1814 continues to monitor whether a trigger event has occurred and loops back in a wait state until such an event has occurred. Upon detection of a trigger event, control proceeds to block 1816 which initiates playback of a parameter compensation pattern synchronized to the occurrence of the triggering event.

Once playback is initiated, control proceeds to block 1818. At block 1818, parameter adjustments are obtained from block A 1824. The parameter adjustments that form a correction pattern are in various embodiments determined in accordance with an expected impedance fluctuation referenced to an event, such as sequencing of an RF signal output from bias RF generator 712*b* of FIG. 7. Once the parameter adjustments or corrections are obtained, typically in relation to the trigger event, control proceeds to block 1820 in which the parameter adjustments are applied, such as by applying parameter adjustments or offsets in a pattern to the RF signal output from RF generator 1612*a*. The one or a plurality of adjustments or corrections can include frequency. Control proceeds to block 1826 which returns control to monitor for a next trigger.

FIG. 18 includes blocks 1824 which call the iterative learning control flowchart of FIG. 12. Blocks 1824 are shown in phantom to indicate that the parameter compensation pattern can be executed prior to occurrence of a triggering event, as indicated by connection to block 1812. The parameter adjustment pattern may remain fixed until updated. In an alternative approach, the parameter adjustment pattern may be updated dynamically or continuously in a background operation, as shown by a dotted line connection to block 1818.

In various embodiments the trigger event, such as discussed with respect to block 1814, is intended to synchronize bias RF generator 712*b* with source RF generator 712*a* or 1612*a* or so that parameter adjustments can be appropriately applied relative to the bias RF signal, thereby minimizing impedance fluctuation. Synchronization between RF generators 712*a* or 1612*a* and 712*b* can occur using control signal 730 or 730' which may provide a synchronization pulse or may replicate the RF signal output from RF generator 712*b*. In various other embodiments, synchronization with RF generator 712*b* can occur without a direct connection such as control signal 730 or 730' or other direct connection between RF generators 712*a* or 1612*a* and 712*b*.

Synchronization without a direct connection can be achieved by analyzing the impedance fluctuation and phase-locking to a signal indicating the impedance fluctuation. For example, by analyzing signals X, Y output from sensor 716*a* or 1616*a*, a signal indicating the impedance fluctuations can be generated. This signal can provide the appropriate trigger event. A signal indicating impedance fluctuation can be developed by performing a Fast Fourier transform (FFT) on the impedance fluctuation. In this configuration, the source RF generator 712*a* or 1612*a* can effectively work as a standalone unit without connection to bias RF generator 712*b*.

The trigger events described in the various embodiments above are typically related to a periodicity of the trigger event. For example, the control signal received from bias RF generator 712*b* output control signal 730 or 730' may repeat periodically in accordance with the RF signal output from RF generator 712*b*. Similarly, the above-discussed signal indicating an impedance fluctuation may also have a periodicity to it.

In various embodiments, varying perturbation patterns can be employed to estimate the required gradient information. By way of nonlimiting example, bins can be grouped, such as shown at sections 1124, 1126 of FIG. 11, and the group bins can be perturbed simultaneously to identify local gradients. In various other embodiments, the amplitude of the perturbation signal can be adjusted as a function of the magnitude of the cost metric. That is, as the cost metric approaches zero, the amplitude of the perturbation can be correspondingly reduced as well.

In various other embodiments, alternate basis functions can be used to reduce the number of parameters that must be optimized. That is, with respect to FIGS. 14 and 15, waveforms 1414 and 1514, respectively, can be selected as a correction pattern. Rather than perturbing each bin individually to determine a local gradient and learning independent actuator values for each bin of the correction pattern or hopping pattern, a predetermined adjustment or hopping pattern can be applied, and a DC offset and scaling factor can be used to adjust the hopping pattern. In various other embodiments, the shape of the adjustment pattern or hopping pattern may be fairly consistent under varying operating conditions. When using a predetermined hopping pattern and varying a DC offset and scaling the hopping profile or correction profile, the approach described in FIGS. 12 and 13 can be used to determine variations in the DC offset and scaling of the hopping profile. In various other embodiments, a DC offset and an orthogonal initial hopping pattern or adjustment pattern and additional basis vectors orthogonal to each of the DC shift and initial hopping pattern and to each other enable capturing more granular characteristics of the hopping pattern. The orthogonal basis set can be determined prior to initiating fabrication process steps in the reactor or can be learned dynamically as a data dependent basis set.

The system and method described above enables constant power delivery from an RF source in the presence of periodic load disturbances, such as a source RF generator maintaining constant power delivery in the presence of a lower frequency bias RF generator. The method and system described above also enables significant reduction in the reflected power at the source RF generator by reducing IMD induced by a second, lower frequency generator, such as a bias RF generator, connected to the same load. Reduction of IMD allows for less costly hardware for the same delivered power output from the source RF generator.

The apparatus and methods described herein also enable an automated approach to determining the required actuator profile of the generator, such as a frequency hopping pattern or correction pattern. It will be actuated synchronously with the period of the lower frequency, bias RF generator. The system and methods described herein also enable maintaining a constant delivered power through a reduced reflected power profile during semiconductor fabrication in the nonlinear reactor. This automated tuning approach improves upon a manually implemented approach that is slower and cannot be implemented dynamically.

Figure 19:
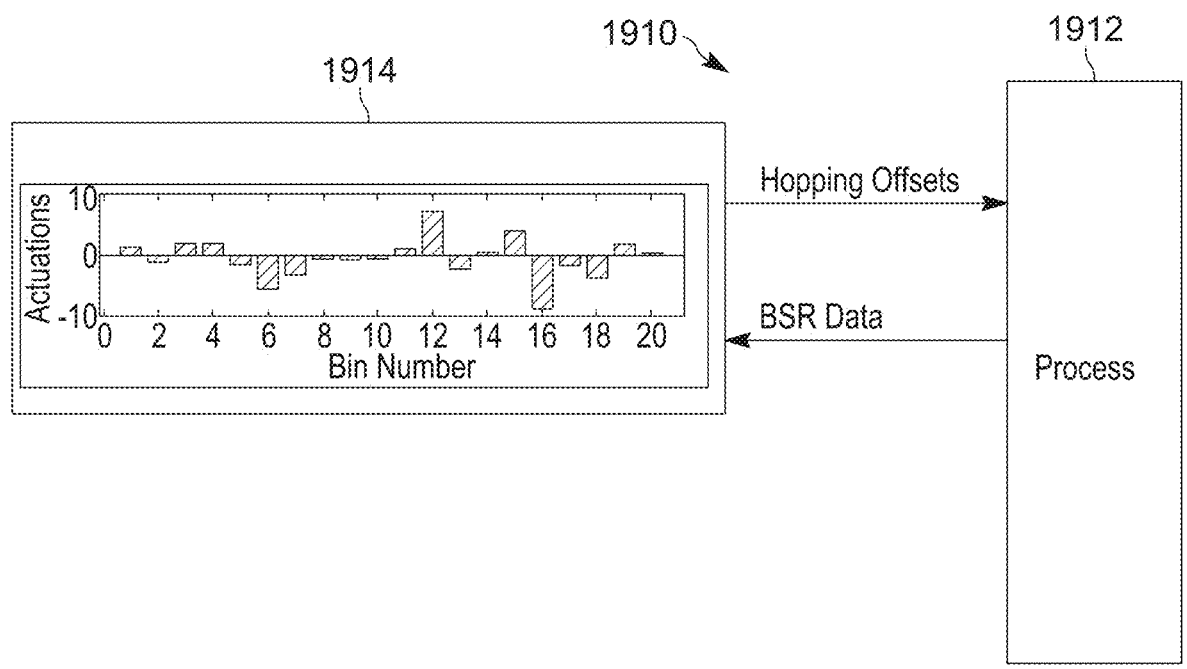
FIG. 19 shows a functional block diagram of a portion of periodic disturbance compensation system, including actuation values for each bin of a 20 bin system.

FIG. 19 shows a functional block diagram of a portion of periodic disturbance compensation system, including actuation values or signals for each bin of a 20 bin system. In FIG. 19, process 1912 receives hopping offset values or signals stored in memory or generated dynamically that correspond to one of a respective actuator value or signal that corresponds to a respective bin of the set of 20 bins. The bins and respective actuator values or signals are shown in waveform or plot 1914. Each bin has an assigned actuator value or signal. It should be understood that the number of bins may vary in accordance with various design considerations. In various nonlimiting examples, however, a set of 20 bins will be used for purpose of discussion. Each bin represents a basis dimension of waveform or plot 1914 and is used to extract a gradient to minimize cost.

The hopping offsets output from waveform or plot 1914 are input to process 1912, and feedback Bin Synchronized Readback (BSR) data is output by process 1912 to a processor or controller (not shown) that generates an update to waveform or plot 1914. Thus, the actuator values shown in waveform or plot 1914 are dynamically generated in accordance with BSR data returned from process 1912. In various configurations, process 1912 represents the generation of an output signal from a RF generator (described above) to perturb the RF output power and frequency from the generator. Further, in various configurations, the RF generator controlled in accordance with the received hopping offsets may have the hopping offsets applied in response to the output of a second RF generator, as described above. In various configurations, the hopping offsets control the output of a RF source generator and are synchronized to the output of a RF bias generator, both of which are described above.

Figure 20:
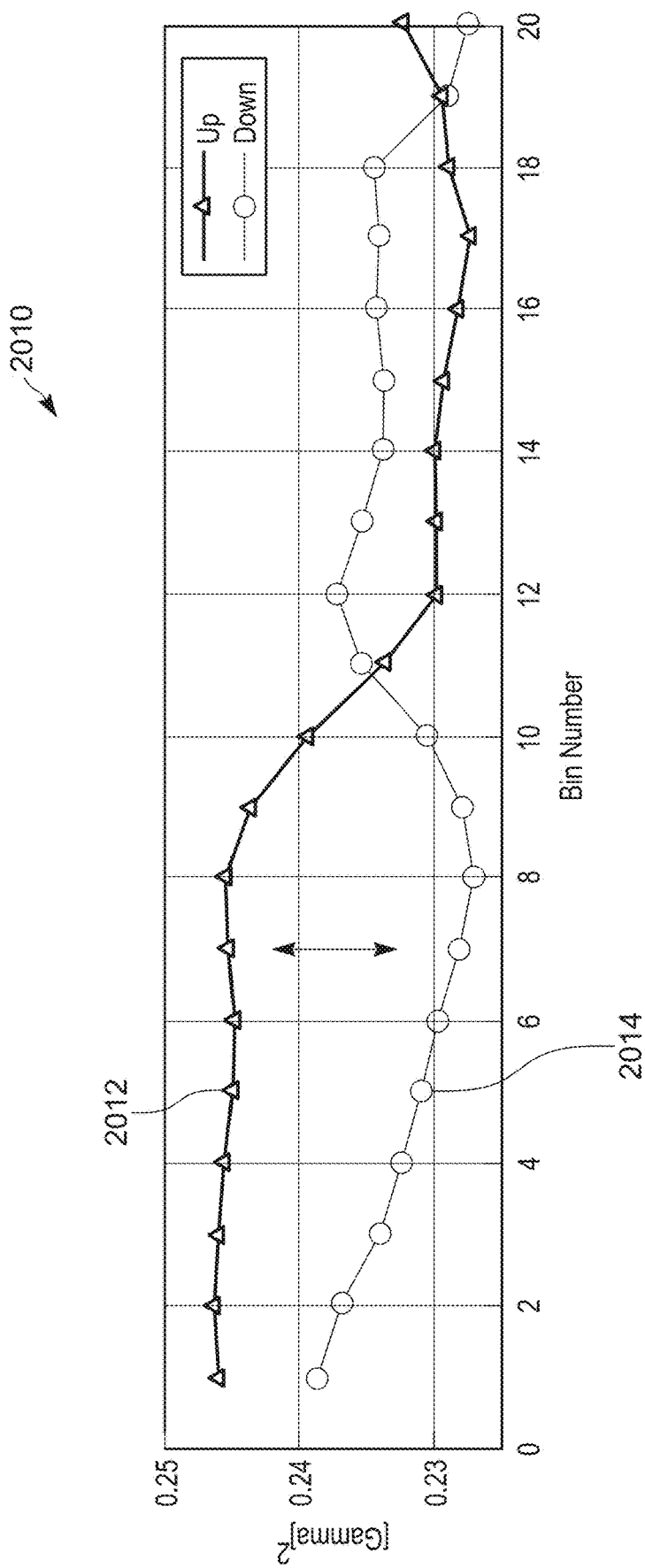
FIG. 20 shows waveforms of upward and downward variation of the square of the reflection coefficient in response to perturbations.

FIG. 20 shows plots or waveforms 2010 of performance data that indicates the response of the square of the reflection coefficient ($|\Gamma|^2$) to an upward perturbation waveform or plot 2012 or a downward perturbation waveform or plot 2014. FIG. 20 thus provides an indication of the delivered power in accordance with the perturbation of each of the 20 bins. In various instances, a downward perturbation or an upward perturbation may cause either an increase or a decrease in delivered power.

In various configurations, the actuator values or hopping offsets corresponding to each bin shown in waveform or plot 1914 may be updated in accordance with Equation (1), where the updated actuator value for a selected bin is determined in accordance with a present actuation value and the cost gradient resulting from perturbing the selected bin. While Equation (1) represents an update for a single bin, a set of actuator updates $u_{k+1}$ can be defined for the complete set of bins as shown in Equation (6):

$$u^{k+1} = u^k - \mu \left( \frac{\partial C}{\partial u_1}, \frac{\partial C}{\partial u_2}, \ldots, \frac{\partial C}{\partial u_n} \right)^T \tag{6}$$

where:
$u^k$ is the present set of actuator values or signals;
$\mu$ is the learning rate,
C is the measured cost, and the indicated partial derivatives are the individual gradients resulting from perturbing bin j, where j is an integer from 1 to n; and
T indicates a transposition of the set of values.

In the example described herein, n=20, but will vary in accordance with the number of bins.

The above described approach defines a relationship between a bin approach and a basis function approach. Further, the Equation (6) described above is a specific instance of the basis function method, since the bins form an elementary basis set, as shown below:

$$\begin{bmatrix} (1, 0, 0, 0, 0, 0, 0, 0, 0, 0, 0, 0, 0, 0, 0, 0, 0, 0, 0, 0) \\ (0, 1, 0, 0, 0, 0, 0, 0, 0, 0, 0, 0, 0, 0, 0, 0, 0, 0, 0, 0) \\ \vdots \\ (0, 0, 0, 0, 0, 0, 0, 0, 0, 0, 0, 0, 0, 0, 0, 0, 0, 0, 1, 0) \\ (0, 0, 0, 0, 0, 0, 0, 0, 0, 0, 0, 0, 0, 0, 0, 0, 0, 0, 0, 1) \end{bmatrix}$$

In the elementary basis set described above, each line describes a basis vector and a "1" indicates the particular bin to be perturbed in a particular iteration. As can be seen, in order to perturb each bin, the above-described approach requires 20 iterations of perturbing each successive bin, $bin_1$ through $bin_{20}$. Following the perturbation of a particular bin, the cost gradient for that particular bin is determined, followed by determining an actuator update for that bin.

Figure 21:
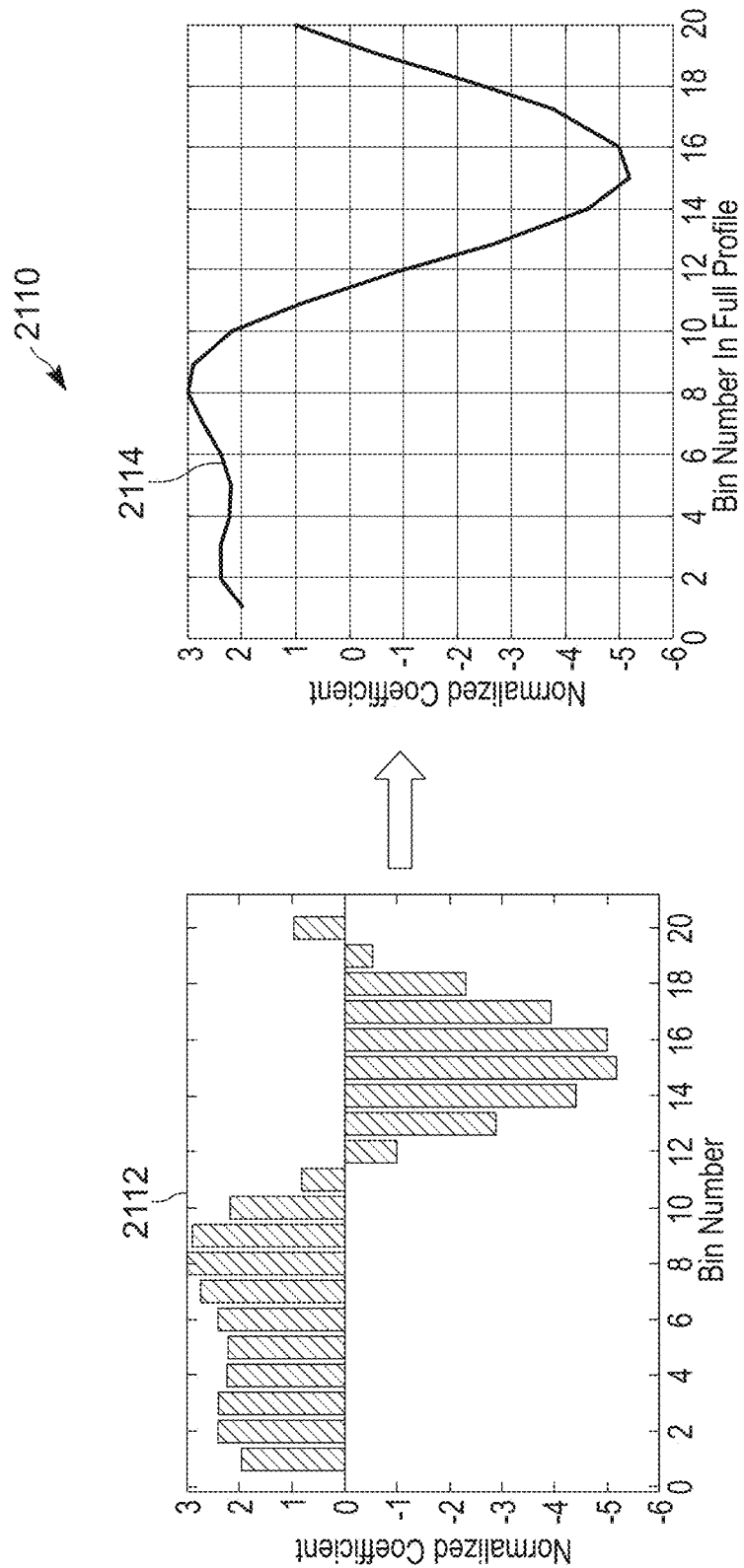
FIG. 21 shows a relationship between normalized coefficients for each bin and normalized coefficients in full profile in a one-to-one correspondence.

FIG. 21 shows a correspondence 2110 between normalized coefficients for each bin and normalized coefficients in full profile for a one-to-one correspondence between each bin. Waveform or plot 2112 shows a set of discrete, uniformly spaced bins forming a 20-dimensional elementary basis set. There is one-to-one mapping from the bins of waveform or plot 2112 to the temporal sample points along the output actuator profile shown in waveform or plot 2114. Waveform or plot 2114, thus, shows a waveform constructed from the individual bins found in plot 2112.

The above-described approach provides a flexible approach for tuning individual bins. However, such an approach can be less efficient for optimizing the hopping pattern, since the number of bins or dimensions are adjusted one-by-one, and the cost gradient and subsequent actuator update are determined following the adjustment of each bin. Thus, it is desirable to provide a more efficient approach to updating the actuators without cycling through each dimension or bin of waveform or plot 1914 or waveform or plot 2112.

Figure 22:
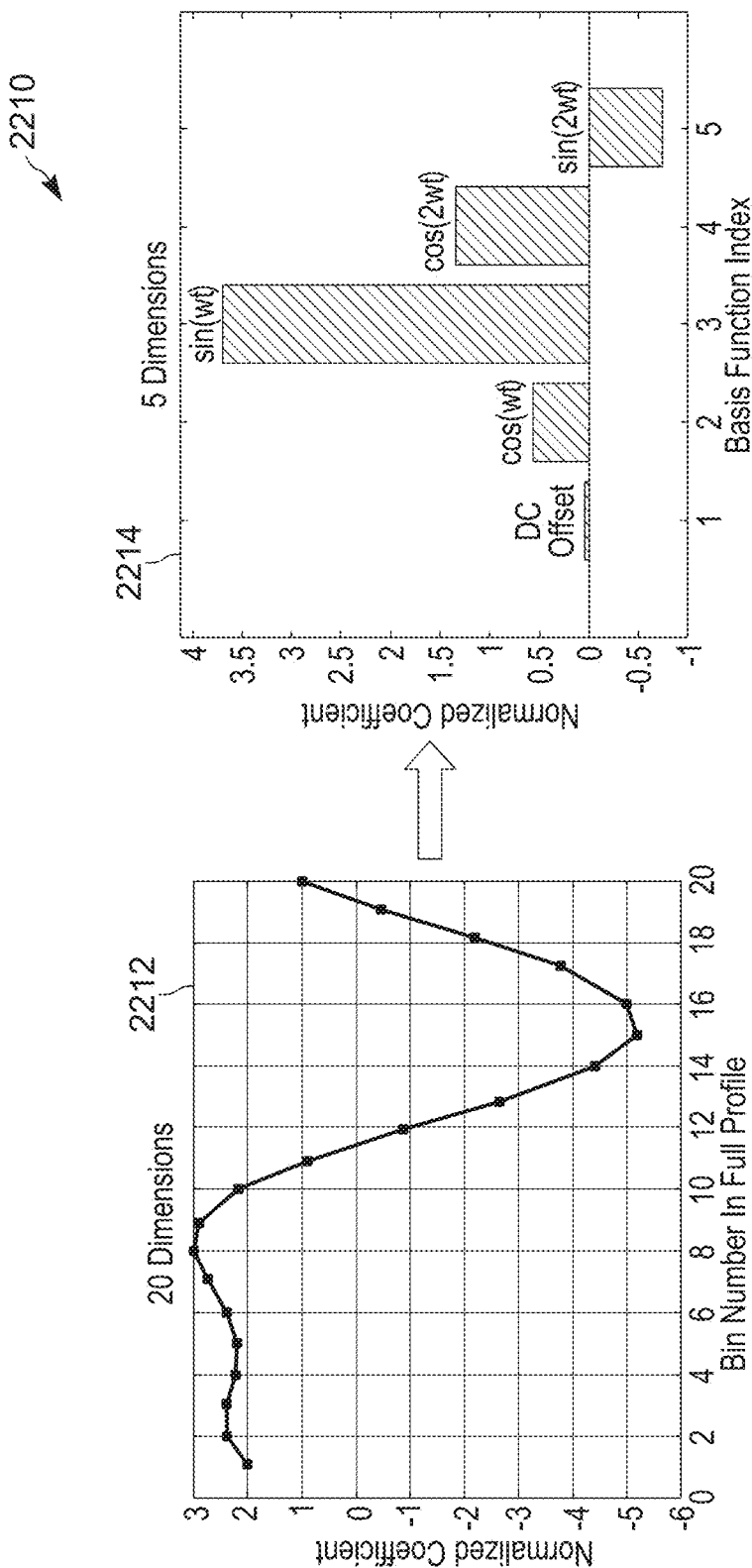
FIG. 22 shows a relationship between normalized coefficients for each bin in full profile and a Fourier series basis for a many-to-fewer correspondence between each bin and a basis function index.

FIG. 22 shows a relationship 2210 between normalized coefficients for each bin and normalized coefficients in full profile for a many-to-fewer correspondence between each bin and a basis function index. That is, the number of basis function indexes is less than the number of bins. Waveform or plot 2212 replicates waveform or plot 2114 and indicates a nonlimiting example of a compensation waveform or a hopping pattern. Waveform or plot 2214 indicates a representation of waveform or plot 2212 reduced from 20 dimensions to, by way of nonlimiting example, 5 dimensions. Waveform or plot 2214 represents a normalized magnitude of a Fast Fourier Transform (FFT) of waveform or plot 2212. As can be seen, waveform or plot 2212 shows a relationship between 20 bins in full profile and normalized coefficients corresponding to each of the 20 bins in full profile. Plot 2214, on the other hand, shows a relationship between a basis function index having 5 dimensions and normalized coefficients corresponding to each of the 5 dimensions. As can also be seen in plot 2214, the basis function indexes or dimensions 1-5 correspond to DC offset, $\cos(\omega t)$, $\sin(\omega t)$, $\cos(2\omega t)$, $\cos(2\omega t)$, respectively. It will be understood that more or fewer basis function indexes or dimensions can be determined using the FFT. Here, W is the radian frequency of the synchronization signal and t represents time over one period of the synchronization signal. In various configurations, t is sampled to correspond to an associated bin number.

Particular relevance can be found in the reduction from 20 bins or dimensions in full profile to a lesser number. According to the present disclosure, the 5 basis function indexes or dimensions each define a basis vector or basis function—DC offset, $\cos(\omega t)$, $\sin(\omega t)$, $\cos(2\omega t)$, and $\sin(2\omega t)$ —that are perturbed, compared to perturbing the 20 bins or dimensions in full profile showing in waveform or plot 2212. In various configurations, more dimensions can be used to improve precision, which can impact efficiency, and fewer dimensions can be used to improve efficiency, which can impact precision. The basis vectors or basis functions can be described generally as having (1+2n) dimensions, including DC offset, cos(ωt), sin(ωt), cos(2ωt), sin(2ωt), ..., cos(nωt), and sin(nωt). In various configurations, the DC offset dimension may be omitted. In various other configurations, the DC offset dimension may be determined using a separate process, such as in a conventional frequency tuning loop. Further, as shown in waveform or plot 2214, each dimension, basis vector, or basis function is scaled or weighted by a normalized coefficient in accordance with the FFT.

Figure 23:
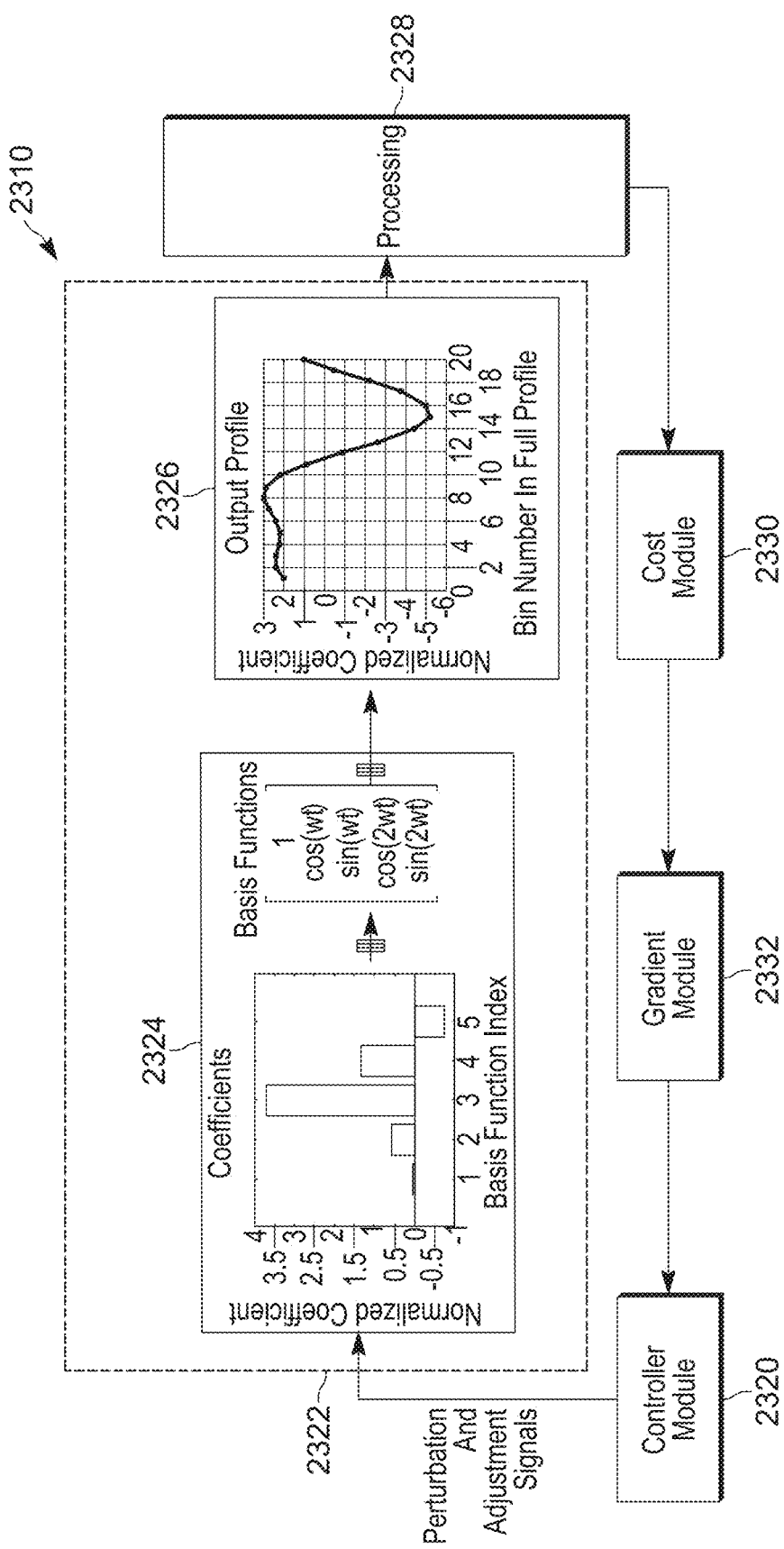
FIG. 23 shows a functional block diagram of periodic disturbance compensation system arranged according to the present disclosure.

FIG. 23 shows a functional block diagram of periodic disturbance compensation system 2310 arranged according to the present disclosure. The functional block diagram of FIG. 23 includes a portion of one or more of FIGS. 7, 13, and 16. Periodic disturbance compensation system 2310 includes control module 2320 that outputs perturbation and adjustment signals to output generator module 2322. Output generator module 2322 includes profile generator module 2324. Profile generator module 2324 stores coefficients, such as coefficients referenced in waveform or plot 2214. The coefficients are used to scale the basis functions or basis vectors. Referring to the 5 dimension example of FIG. 22, the basis functions or basis vectors are as described above, namely, DC offset, cos(ωt), sin(ωt), cos(2ωt), and sin(2ωt). The basis functions or basis vectors cooperate to define an output profile 2326 that defines the offsets for each bin.

Each basis function or basis vector defines an offset value or signal for each bin of the profile. By way of comparison to the perturbation approach using the elementary basis set described above, rather than perturbing a single bin and processing over 20 iterations of perturbing each of the 20 dimensions of the elementary basis set, each coefficient of the basis functions or basis vectors of the 5 dimension basis is perturbed. The product of the perturbed coefficient and its associated basis function or basis vector is used to perturb each of the 20 bins each iteration. Each basis function or basis vector, scaled by its associated perturbed coefficient, defines a perturbation that influences each of the 20 bins, so that each of the 20 bins are perturbed through each of the 5 iterations of perturbing the basis function or basis vector by scaling it using its associated perturbed coefficient.

Output profile 2326 is input to process 2328. Process 2328 controls the output of an RF generator. In various configurations, the normalized coefficients from the waveform or plot stored in or generated by profile generator module 2324 are transformed by an inverse FFT (FFT$^{-1}$) to generate output profile 2326. Output profile 2326 controls the output of a first RF generator. In various configurations, output profile 2326 controls one or more parameters of the first RF generator, where the one or more parameters may be frequency, power, or phase. In various configurations, the one or more parameters are responsive to input from a second RF generator. In various configurations, the one or more parameters adjusts the output frequency of a source RF generator in order to respond to input from a bias RF generator.

Various parameters of process 2328 may be monitored and output to cost module 2330. Cost module 2320 determines the cost of one or more monitored parameters. In various configurations, and as described above, an output metric or metrics of interest is determined. In various configurations, the output metric or metrics of interest can be determined in accordance with the monitored parameters and may be one or more of average reflected power, delivered power, or average magnitude of the reflection coefficient over the operating period of the bias generator, such as RF generator 712b of FIG. 7. The metric or metrics of interest can also be referred to as a cost function, which when optimized indicates when a satisfactory adjustment pattern has been determined. Cost module 2330 outputs a cost to gradient module 2332, which determines a gradient or change in the cost in response to perturbation of the selected parameter or parameters. Gradient module 2332 outputs a gradient value or signal to control module 2320 which determines the perturbation and adjustment signals in response to the gradient value or signal received from gradient module 2332. Determination of the perturbation and adjustment signals occurs as described above.

By using a basis space with fewer dimensions, substantial tuning speed increases may be realized, since groups of bins are being perturbed according to the sinusoidal profile defined by the FFT, rather than by perturbing individual bins. In various configurations, various basis coefficients corresponding to a particular dimension can be updated at different rates. By way of nonlimiting example, in various configurations, the DC offset component may be tuned every iteration of the controller, such as control module 2320, while other basis components may be updated every other iteration of control module 2320. In other various configurations, the DC offset component and fundamental (n=1) sine and cosine pair may be tuned one after the other (DC offset, cos(ωt), and sin(ωt)), in sequential iterations, such as three sequential iterations in one nonlimiting example. Higher harmonic sine and cosine components (cos(2ωt) and sin(2ωt)), can be mixed in at lower rates, such as by way of nonlimiting example, every forth iteration. Using this approach, update rates may be a function of measured sensitivity of the cost function along that basis dimension, and more sensitive dimensions may be tuned more often.

Further, in various configurations, various individual basis components can be dynamically tuned or maintained as fixed. By way of nonlimiting example, higher harmonic components of a Fourier basis may remain fixed until the cost function falls below a threshold. After the cost function falls below a minimum threshold, higher harmonic components of the Fourier basis may be tuned. In such a configuration, a coarse tune is established while maintaining the individual basis components of the higher harmonics fixed, and a fine-tune is applied by subsequently tuning higher harmonic components of the Fourier basis. Further in various configurations, a gradient descent can be maintained along a single dimension for each iteration. In such a configuration, a gradient is established for one of the basis dimensions by only perturbing the normalized coefficient for that particular basis, and updating the normalized coefficient for that particular basis each iteration, rather than updating a composite gradient encompassing all basis dimensions. The basis dimension for each iteration can be selected randomly in a stochastic mode, or may be cycled through any predetermined sequence. Further, by using an orthogonal basis set, such as a Fourier basis, a Legendre (polynomial) basis, or the elementary basis, the coefficient for each basis dimension can be updated independently from the others. Further, in various configurations, to the extent possible, each of the various configurations described herein may be implemented individually or combined manner.

Figure 24:
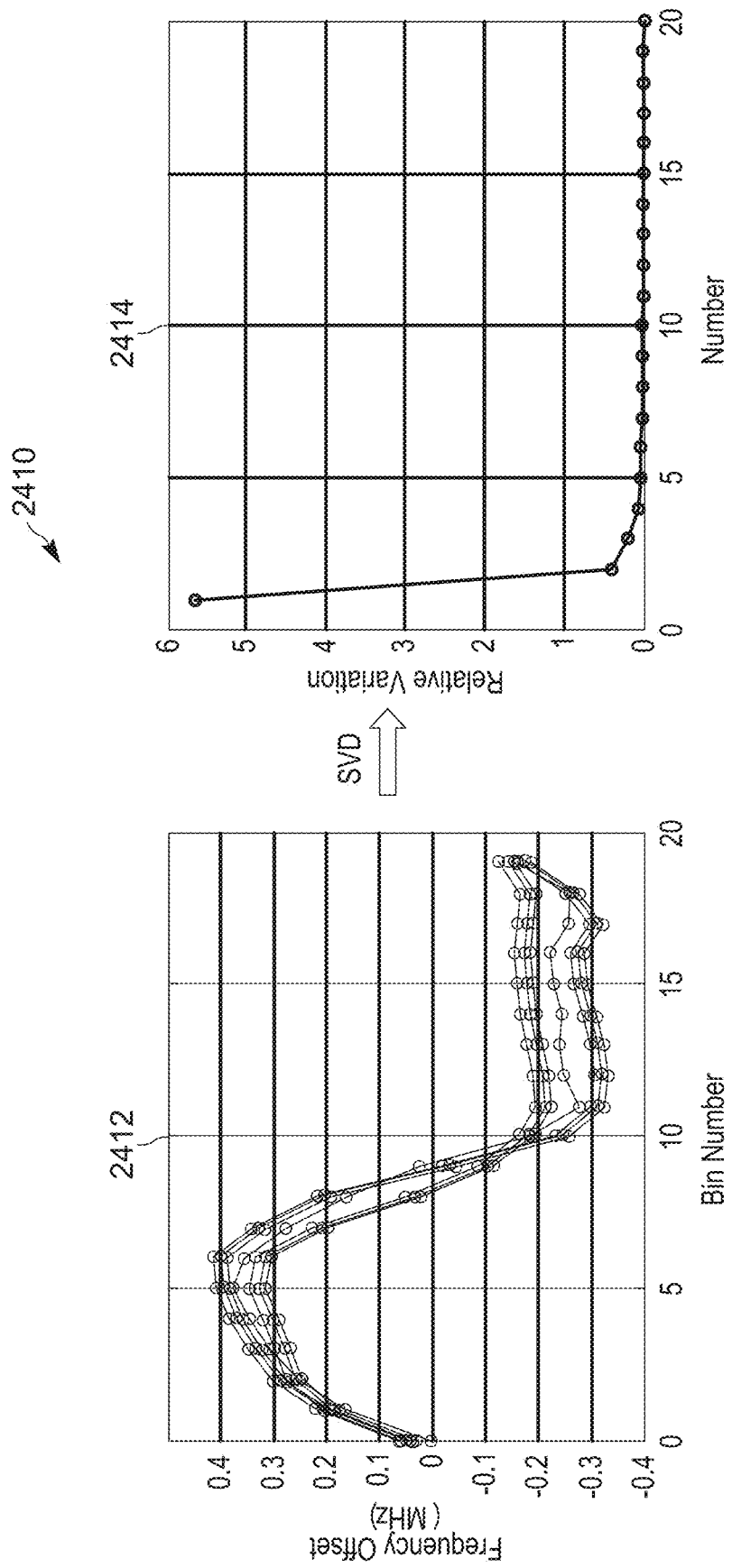
FIG. 24 shows a relationship between learned hopping patterns and singular values of a matrix of frequency offsets derived using singular value decomposition (SVD)

FIGS. 22 and 23 depict a generalized approach using predetermined basis functions, such as sine and cosine, to reduce the number of dimensions to generate an output profile compared to relying on the elementary basis set. In various other configurations, data may be collected and analyzed to determine how the process reacts, and the reaction of the process can be used to define data dependent basis functions or basis vectors. FIG. 24 shows a relationship 2410 between learned hopping patterns and singular values of a matrix of frequency offsets derived using data analysis. In FIG. 24, waveforms or plots 2412 show a series of learned hopping patterns following the occurrence of a predefined event in a power delivery system. In FIG. 24, a Singular Value Decomposition (SVD) analysis results in waveform or plot 2414. The horizontal axis of waveform or plot 2414 corresponds to the number of dimensions, while the vertical axis of waveform or plot 2414 corresponds to the relative variation in the data that is captured by that added basis dimension. In a nonlimiting example of waveform or plot 2414, the first five singular values may be used based on the relative variation of waveform or plot 2414. These 5 dimensions can then be used to reconstruct or estimate the waveforms or plots 2412 using fewer input dimensions than the original 20 dimensions (bins) of waveforms or plots 2412. In various configurations, data analysis can be affected using principal component analysis (PCA), rather than SVD. It will be noted that using either SVD or PCA, the coefficients for each basis dimension can be updated independently from the other basis dimensions as they define an orthogonal basis set.

Waveform or plot 2414 indicates that the greatest variation occurs within the first 5 dimensions. From waveform or plot 2414, a set of key basis vectors can be generated, such as from dimensions 1-5 of waveform or plot 2414. By adding a weighted sum of the selected key basis vectors, an output actuator profile can be generated. By way of nonlimiting example, the weighted sum of the key basis factors added together can result in an output profile similar to the output profile of waveform or plot 2212 of FIG. 22. Thus, using a data analysis approach and selecting key basis factors based on the relative variation can result in an output profile similar to the output profile generated using a FFT.

FIGS. 25A-25E show individual basis vectors for a 5 dimension basis vector implementation of a periodic disturbance compensation system arranged according to the present disclosure. By way of nonlimiting example, FIGS. 25A-25E may be derived from the relative variation in waveform or plot 2414. Waveform or plot 2510A corresponds to a first basis vector (analogous to a DC offset) or first dimension, and waveform or plot 2510B corresponds to a second basis factor or second dimension. Similarly, waveform or plot 2510C corresponds to a third basis vector or third dimension, waveform or plot 2510D corresponds to a fourth basis vector or fourth dimension, and waveform or plot 2510E corresponds to a fifth basis factor or fifth dimension.

Figure 25A:
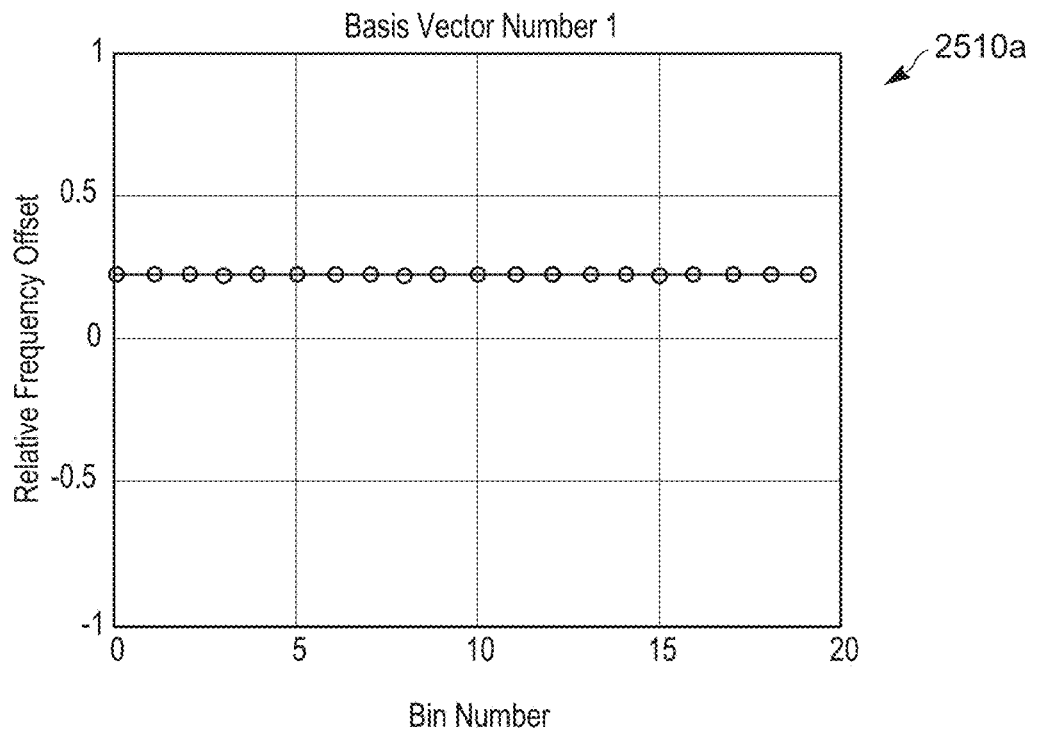
FIGS. 25A-25E show individual basis vectors for a five dimension basis vector implementation of a periodic disturbance compensation system arranged according to the present disclosure.
Figure 25B:
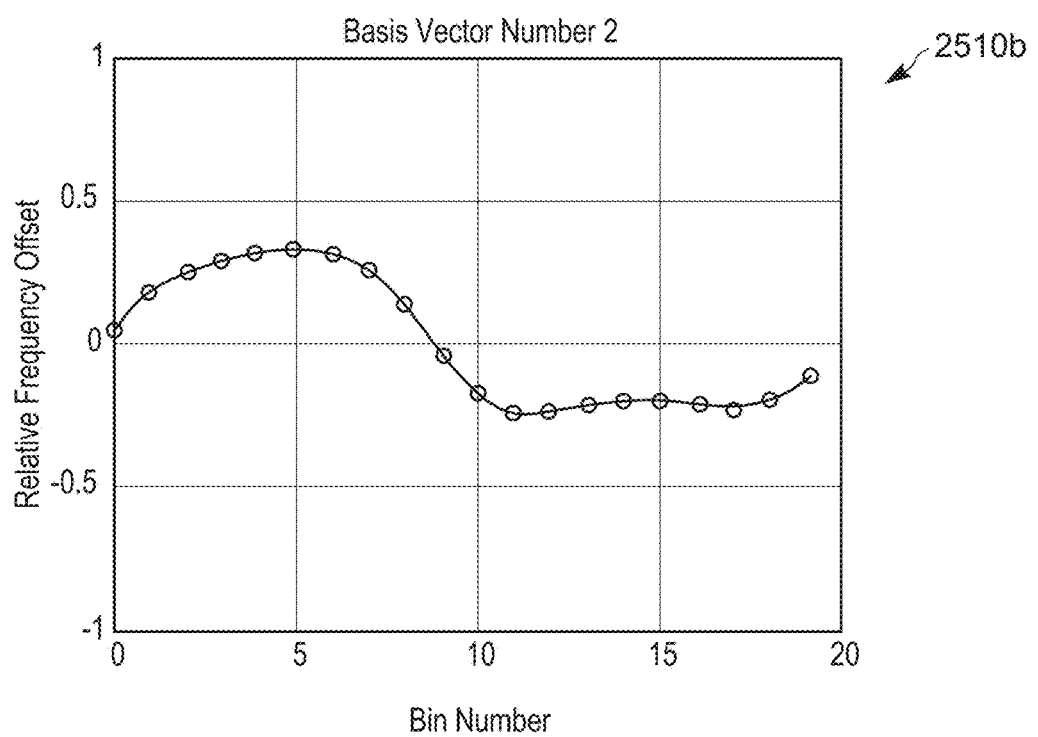
Figure 25C:
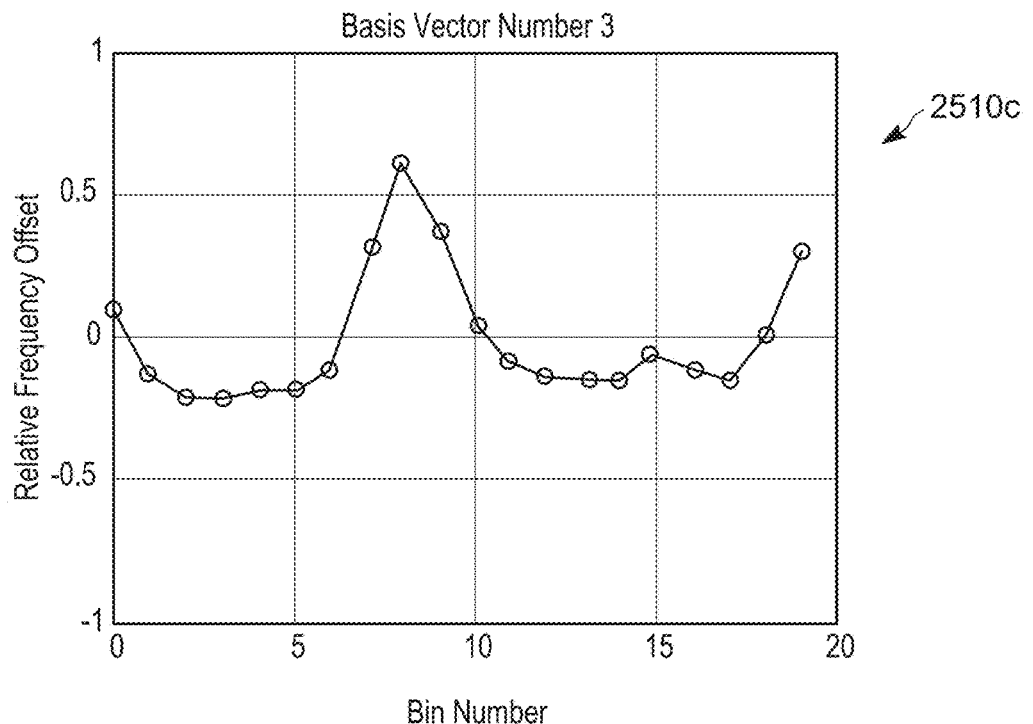
Figure 25D:
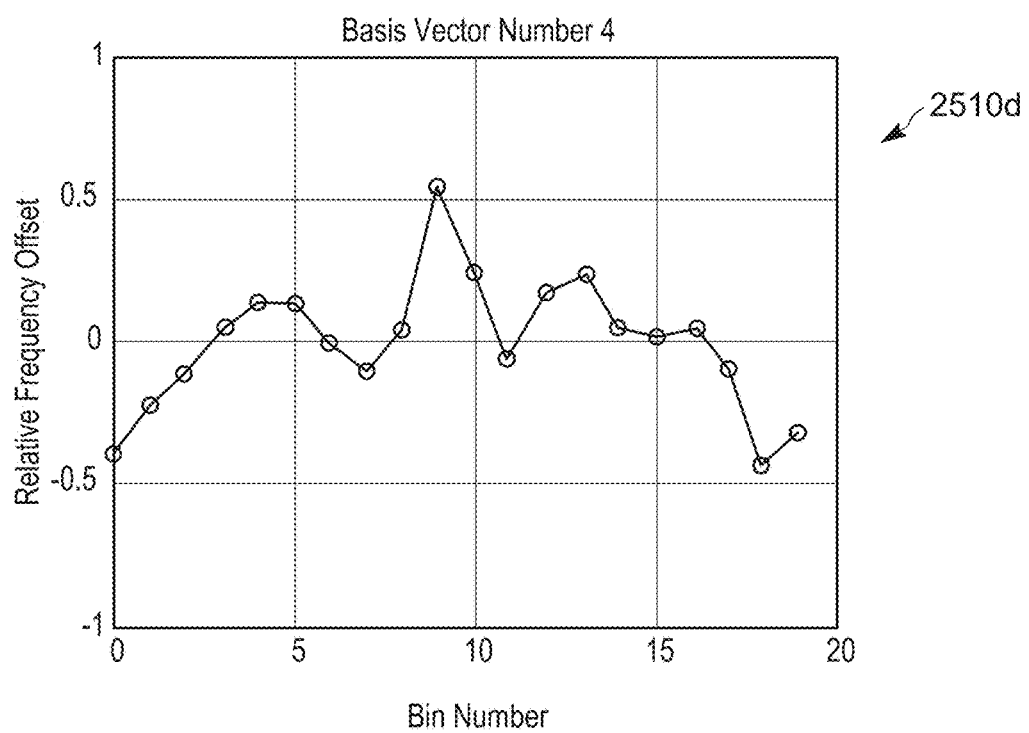
Figure 25E:
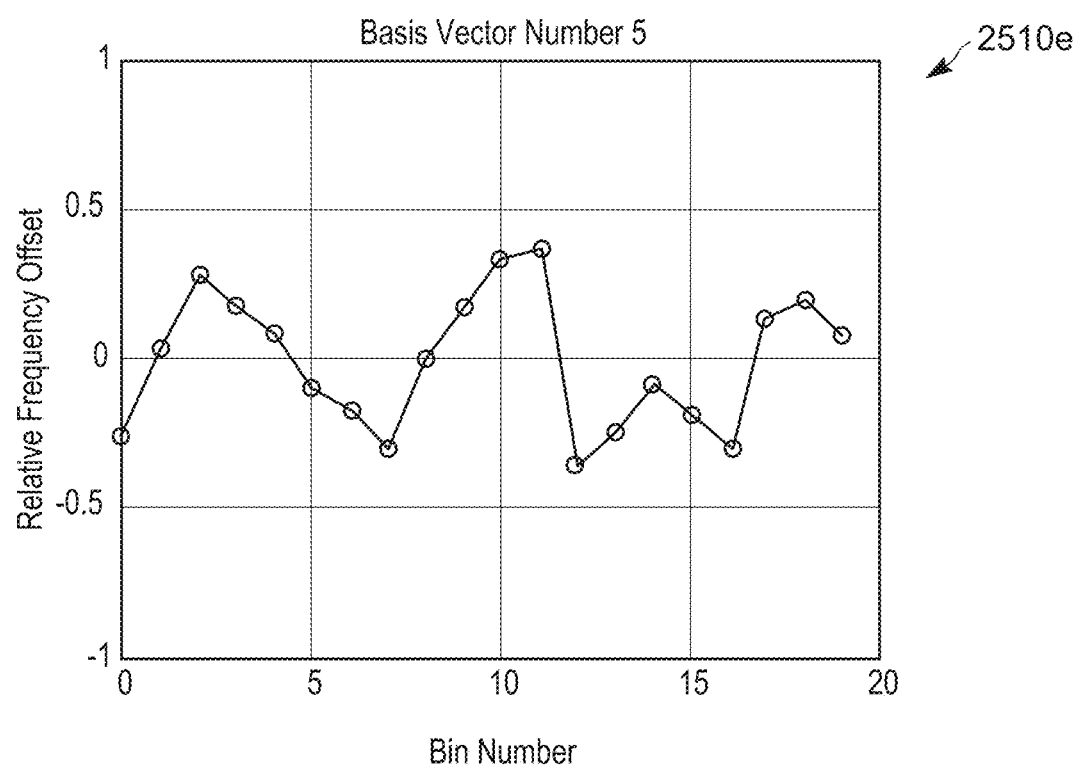

In the configuration of FIGS. 24 and 25A-25E, singular vectors in each of FIGS. 25A-25B form an ortho-normal basis set. Hopping patterns can be learned as linear combinations of basis vectors. The basis set is ordered in terms of variation capture among the hopping patterns across changes in the RF generator configuration and data capture scenarios. In various configurations, a subset of basis vectors may be learned for improved convergence in order to capture selected qualities of the hopping pattern. A data dependent basis assumes that the data used to derive the basis set comprehends all expected variations. In various configurations, heuristics may be used to force basis vector 1 to be constant in order to apply mean frequency tuning. In various configurations, basis vector 2 is a first singular vector since it captures the main form of the hopping pattern. Basis vectors 3-5 of FIGS. 25C-25E provide additional, fine tuning beyond the effects of basis vector 1 and basis vector 2.

In various configurations, data-driven basis vectors may be developed for different customer recipe steps in a plasma fabrication process. The recipe-specific basis vectors may be developed and applied as the plasma fabrication recipe changes. Alternatively, or in addition to, data-driven basis vectors may be combined into an orthogonal library and used across various recipe steps. In various further configurations, a library of basis vectors can be derived and collected across multiple customer tools in order to promote tool matching. Further, in various configurations, one of the derived basis vectors could implement a full solution profile from a prior run of a recipe step, and future, similar recipe steps can rely on the stored full solution from the prior run.

In various configurations, options for generic basis functions could include sinusoid, spline, polynomial, exponential, and radial basis functions. Each of the above-noted functions may be configured as orthogonal functions. Further, in various configurations, separate learning rates and sensor amplitudes, either individually or in combination, can be established for each of the basis dimensions. In yet further various configurations, basis functions may have different temporal granularity in which, by way of nonlimiting example, several bins may be grouped to move together in one region of the actuator profile. In various other configurations, a hybrid of derived basis functions, such as data-driven basis functions, and generic basis functions, such as FFT or Legendre basis functions, may be employed to define a hopping pattern. In various other configurations, the basis functions can be changed dynamically so that, by way of nonlimiting example, a Fourier basis function with two harmonics may be employed to tune quickly, and then additional harmonic dimensions of the Fourier functions may be used to fine-tune the hopping pattern. The transition between the above-describe coarse-tune and fine-tune could be based on the number of iterations or the value of the cost function relative to a threshold, or a combination of the two. In various other configurations, different cost functions may be employed for each basis dimension. By way of nonlimiting example, the DC offset basis function can be tuned with respect to average reflected power, while the sinusoidal components of the Fourier portion of a basis function could vary in accordance with the positive and negative half-cycle and reflected power envelope. In one configuration of this approach, the cost function can be represented by Equation (5).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase at least one of A, B, and C should be construed to mean a logical (A OR B OR C), using a non-exclusive logical OR, and should not be construed to mean "at least one of A, at least one of B, and at least one of C." The term subset does not necessarily require a proper subset. In other words, a first subset of a first set may be coextensive with (equal to) the first set.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Nonlimiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, ObjectiveC, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A controller for a radio frequency generator comprising:
   a RF power controller coupled to a RF power source, the RF power controller configured to generate a control signal to vary an RF output signal having a plurality of bins from the RF power source, the RF power controller configured to adjust at least one parameter that determines a characteristic of the RF output signal in response to a synchronization signal,
   wherein the parameter is perturbed in accordance with a hopping pattern associated with the plurality of bins, and the parameter is adjusted in accordance with one of minimizing or maximizing a cost function responsive to a perturbation of the at least one parameter by the hopping pattern, and
   wherein the hopping pattern is adjusted in accordance with a basis set having a plurality of dimensions and a number of dimensions is fewer than a number of bins.

2. The controller of claim 1, wherein the RF power controller iterates through the dimensions in order to adjust the hopping pattern each iteration.

3. The controller of claim 2, wherein more than one of the plurality of bins is adjusted during each iteration.

4. The controller of claim 1, wherein more than one of the plurality of bins is adjusted during each iteration.

5. The controller of claim 1, wherein the hopping pattern may be adjusted by applying one of an offset or a scaling factor to the hopping pattern.

6. The controller of claim 1, wherein the perturbation of the at least one parameter for a plurality of the bins determines the hopping pattern.

7. The controller of claim 1, wherein the basis set is comprised of at least one of a sinusoid, spline, polynomial, exponential, and radial basis function.

8. The controller of claim 1, wherein a first dimension of the basis set is orthogonal to a second dimension of the basis set.

9. The controller of claim 1, wherein each bin has a width and the width of a selected bin may be the same as or different than the width of an other bin.

10. The controller of claim 1, wherein a plurality of the dimensions of the basis set is determined in accordance with a Fast Fourier Transform (FFT) of the hopping pattern.

11. The controller of claim 1, wherein a plurality of the dimensions of the basis set is determined from data analytics.

12. The controller of claim 1, wherein a plurality of the dimensions of the basis set is determined in accordance with singular value decomposition (SVD) or principal component analysis (PCA).

13. The controller of claim 1, wherein the RF power controller adjusts the parameter in accordance with the synchronization signal, wherein the synchronization signal indicates a relative position of an external RF output signal.

14. The controller of claim 1, wherein:
   the parameter is one of a frequency or a frequency offset and includes a plurality of frequencies that the RF power controller introduces to the RF output signal in a predetermined order and timing in accordance with the synchronization signal, or
   the parameter is one of a reactance or a reactance offset and includes a plurality of reactances controlled by the RF power controller in a predetermined order and timing in accordance with the synchronization signal, wherein the reactance is at least one of a capacitance or an inductance.

15. The controller of claim 1, wherein the hopping pattern may be adjusted by applying one of an offset or a scaling factor to the hopping pattern, and the offset is adjusted by perturbing the offset to determine an effect on a cost function, generating a composite gradient in accordance with the cost function, and adjusting the offset in accordance with the one of minimizing or maximizing the cost function.

16. The controller of claim 15, wherein the scaling factor is adjusted by perturbing a present scaling factor to determine an effect on a cost function, generating a composite gradient in accordance with the cost function, and adjusting the scaling factor in accordance with the one of minimizing or maximizing the cost function.

17. The controller of claim 1, wherein a scaling factor is adjusted by perturbing a present scaling factor to determine an effect on a cost function, generating a composite gradient in accordance with the cost function, and adjusting the scaling factor in accordance with the one of minimizing or maximizing the cost function, and adjusting the hopping pattern by applying the scaling factor to the hopping pattern.

18. A non-transitory computer-readable medium storing instructions, the instructions comprising:
   controlling a first power source to output a first output signal having a plurality of bins to a load; and
   generating a control signal to vary the first output signal from the power source to adjust at least one parameter that determines a characteristic of the first output signal in response to a synchronization signal,
   wherein the parameter is perturbed in accordance with a hopping pattern associated with the plurality of bins, and the parameter is adjusted in accordance with one of minimizing or maximizing a cost function responsive to a perturbation of the at least one parameter by the hopping pattern,
   wherein the hopping pattern may be adjusted by applying one of an offset or a scaling factor to the hopping pattern, or
   wherein the hopping pattern is adjusted in accordance with a basis set having a plurality of dimensions and a number of dimensions is equal to or fewer than a number of bins.

19. The non-transitory computer-readable medium of claim 18, the instructions comprising iterating through the dimensions in order to adjust the hopping pattern each iteration.

20. The non-transitory computer-readable medium of claim 19, wherein more than one of the plurality of bins is adjusted during each iteration.

21. The non-transitory computer-readable medium of claim 18, wherein more than one of the plurality of bins is adjusted during each iteration.

22. The non-transitory computer-readable medium of claim 18, wherein the perturbation of the at least one parameter for a plurality of the bins determines the hopping pattern.

23. The non-transitory computer-readable medium of claim 21, wherein the basis set is comprised of basis functions including at least one of a sinusoid, spline, polynomial, exponential, and radial basis function.

24. The non-transitory computer-readable medium of claim 18, wherein each bin has a width and the width of a selected bin may be the same as or different than the width of an other bin.

25. The non-transitory computer-readable medium of claim 18, the instructions comprising determining a plurality of the dimensions of the basis set in accordance with a Fast Fourier Transform (FFT) of the hopping pattern.

26. The non-transitory computer-readable medium of claim 18, the instructions comprising determining a plurality of the dimensions of the basis set using data analytics.

27. The non-transitory computer-readable medium of claim 18, the instructions comprising determining a plurality of the dimensions of the basis set in accordance with singular value decomposition (SVD) or principal component analysis (PCA).

28. The non-transitory computer-readable medium of claim 18, the instructions comprising adjusting the parameter in accordance with the synchronization signal, wherein the synchronization signal indicates a relative position of an external output signal.

29. The non-transitory computer-readable medium of claim 18, wherein:
the parameter is one of a frequency or a frequency offset and includes a plurality of frequencies introduced to the output signal in a predetermined order and timing in accordance with the synchronization signal, or
the parameter is one of a reactance or a reactance offset and includes a plurality of reactances introduced in a predetermined order and timing in accordance with the synchronization signal, wherein the reactance is at least one of a capacitance or an inductance.

30. The non-transitory computer-readable medium of claim 18, the instructions comprising adjusting the hopping pattern by applying one of an offset or a scaling factor to the hopping pattern, and the offset is adjusted by perturbing the offset to determine an effect on a cost function, generating a composite gradient in accordance with the cost function, and adjusting the respective basis set in accordance with the one of minimizing or maximizing the cost function.

31. The non-transitory computer-readable medium of claim 18, the instructions comprising adjusting the scaling factor by perturbing a present scaling factor to determine an effect on a cost function, generating a composite gradient in accordance with the cost function, and adjusting the scaling factor in accordance with the one of minimizing or maximizing the cost function.

32. A power generator system comprising:
a power source, the power source generating an output signal having a variable amplitude and frequency and a plurality of bins; and
a power controller coupled to the power source, the power controller configured to generate a control signal to vary the output signal, the power controller configured to adjust at least one parameter that determines a characteristic of the output signal in response to a synchronization signal,
wherein the parameter is perturbed in accordance with a hopping pattern associated with the plurality of bins, and the parameter is adjusted in accordance with one of minimizing or maximizing a cost function responsive to perturbation of the at least one parameter by the hopping pattern, and
wherein the hopping pattern is adjusted in accordance with a basis set having a plurality of dimensions and a number of dimensions is fewer than a number of bins.

33. The power generator system of claim 32, wherein the power controller iterates through the dimensions in order to adjust the hopping pattern each iteration.

34. The power generator system of claim 33, wherein more than one of the plurality of bins is adjusted during each iteration.

35. The power generator system of claim 32, wherein more than one of the plurality of bins is adjusted during each iteration.

36. The power generator system of claim 32, wherein the basis set is comprised of basis functions including at least one of a sinusoid, spline, polynomial, exponential, and radial basis function.

37. The power generator system of claim 32, wherein a first dimension of the basis set is orthogonal to a second dimension of the basis set.

38. The power generator system of claim 33, wherein a plurality of the dimensions of the basis set is determined in accordance with a Fast Fourier Transform (FFT) of the hopping pattern.

39. The power generator system of claim 32, wherein a plurality of the dimensions of the basis set is determined from data analytics.

40. The power generator system of claim 32, wherein a plurality of the dimensions of the basis set is determined in accordance with singular value decomposition (SVD) or principal component analysis (PCA).

41. The power generator system of claim 32, wherein the power controller adjusts the parameter in accordance with the synchronization signal, wherein the synchronization signal indicates a relative position of an external output signal.

* * * * *